US011164943B2

(12) United States Patent
Yang et al.

(10) Patent No.: US 11,164,943 B2
(45) Date of Patent: Nov. 2, 2021

(54) SEMICONDUCTOR DEVICE AND METHOD FOR FABRICATING THE SAME

(71) Applicant: Samsung Electronics Co., Ltd., Suwon-si (KR)

(72) Inventors: Jung Gil Yang, Hwaseong-si (KR); Dong Il Bae, Incheon (KR); Chang Woo Sohn, Hwaseong-si (KR); Seung Min Song, Yongin-si (KR); Dong Hun Lee, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/928,439

(22) Filed: Jul. 14, 2020

(65) Prior Publication Data

US 2020/0343341 A1 Oct. 29, 2020

Related U.S. Application Data

(63) Continuation of application No. 16/423,641, filed on May 28, 2019, now Pat. No. 10,756,179, which is a
(Continued)

(30) Foreign Application Priority Data

Sep. 29, 2016 (KR) ......................... 10-2016-0125430

(51) Int. Cl.
*H01L 29/06* (2006.01)
*H01L 29/66* (2006.01)
(Continued)

(52) U.S. Cl.
CPC .. *H01L 29/0673* (2013.01); *H01L 21/823431* (2013.01); *H01L 21/823807* (2013.01);
(Continued)

(58) Field of Classification Search
CPC ............. H01L 29/0673; H01L 29/0669; H01L 29/0847; H01L 29/1033; H01L 29/165;
(Continued)

(56) References Cited

U.S. PATENT DOCUMENTS 7,037,768 B2   5/2006   Yun et al.
7,566,364 B2   7/2009   Xianyu et al.
(Continued)

FOREIGN PATENT DOCUMENTS

KR   20150019091 A   2/2015

OTHER PUBLICATIONS

S. Natarajan, et al., "A 14nm SoC Platform Technology Featuring 2nd Generation Tri-Gate Transistors, 70 nm Gate Pitch, 52 nm Metal Pitch, and 0.0499 um2 SRAM cells, Optimized for Low Power, High Performance and High Density SoC Products," IEEE VLSI, pp. T12-T13 (2015).
(Continued)

*Primary Examiner* — Tu-Tu V Ho
(74) *Attorney, Agent, or Firm* — Harness, Dickey & Pierce, P.L.C.

(57) ABSTRACT

A semiconductor device and a fabricating method thereof are provided. The semiconductor device includes a substrate, a first nanowire spaced apart from a first region of the substrate, a first gate electrode surrounding a periphery of the first nanowire, a second nanowire spaced apart from a second region of the substrate and extending in a first direction and having a first width in a second direction intersecting the first direction, a supporting pattern contacting the second nanowire and positioned under the second nanowire, and a second gate electrode extending in the second direction and surrounding the second nanowire and the supporting pattern.

20 Claims, 29 Drawing Sheets

Related U.S. Application Data continuation of application No. 15/877,667, filed on Jan. 23, 2018, now Pat. No. 10,347,718, which is a continuation of application No. 15/463,551, filed on Mar. 20, 2017, now Pat. No. 9,929,235.

(51) Int. Cl.

| | | |
|---|---|---|
| *H01L 29/08* | (2006.01) | |
| *H01L 21/8238* | (2006.01) | |
| *H01L 21/8234* | (2006.01) | |
| *H01L 27/088* | (2006.01) | |
| *H01L 29/165* | (2006.01) | |
| *H01L 29/10* | (2006.01) | |
| *H01L 27/092* | (2006.01) | |
| *H01L 27/02* | (2006.01) | |
| *H01L 29/423* | (2006.01) | |
| *H01L 29/78* | (2006.01) | |
| *H01L 29/786* | (2006.01) | |

(52) U.S. Cl.
CPC .. *H01L 21/823821* (2013.01); *H01L 27/0207* (2013.01); *H01L 27/0883* (2013.01); *H01L 27/0886* (2013.01); *H01L 27/092* (2013.01); *H01L 27/0922* (2013.01); *H01L 27/0924* (2013.01); *H01L 29/0669* (2013.01); *H01L 29/0847* (2013.01); *H01L 29/1033* (2013.01); *H01L 29/165* (2013.01); *H01L 29/42392* (2013.01); *H01L 29/66545* (2013.01); *H01L 29/785* (2013.01); *H01L 29/78696* (2013.01); *H01L 21/82385* (2013.01); *H01L 21/823456* (2013.01)

(58) Field of Classification Search
CPC ......... H01L 29/42392; H01L 29/66545; H01L 29/785; H01L 29/78696; H01L 21/823431; H01L 21/823456; H01L 21/823807; H01L 21/823821; H01L 21/82385; H01L 27/0207; H01L 27/0883; H01L 27/0886; H01L 27/092; H01L 27/0922; H01L 27/0924
USPC ....................................................... 257/369
See application file for complete search history.

(56) References Cited

U.S. PATENT DOCUMENTS

| | | |
|---|---|---|
| 8,580,624 B2 | 11/2013 | Bangsaruntip et al. |
| 9,230,989 B2 | 1/2016 | Chang et al. |
| 9,412,816 B2 * | 8/2016 | Yang ................. H01L 29/66545 |
| 9,466,601 B2 | 10/2016 | Yang et al. |
| 9,590,038 B1 | 3/2017 | Kim et al. |
| 9,704,863 B1 | 7/2017 | Cheng et al. |
| 10,141,311 B2 | 11/2018 | Glass et al. |
| 2007/0080409 A1 | 4/2007 | Seliskar |
| 2013/0341596 A1 | 12/2013 | Chang et al. |
| 2015/0372104 A1 | 12/2015 | Liu et al. |
| 2017/0330934 A1 | 11/2017 | Zhang et al. |

OTHER PUBLICATIONS

Notice of Allowance dated Apr. 9, 2020, issued in corresponding U.S. Appl. No. 16/423,641.

* cited by examiner

SEMICONDUCTOR DEVICE AND METHOD FOR FABRICATING THE SAME

CROSS-REFERENCE TO RELATED APPLICATION

This application is a continuation of U.S. application Ser. No. 16/423,641, filed May 28, 2019, which is a continuation of U.S. application Ser. No. 15/877,667, filed on Jan. 23, 2018, which is a continuation of U.S. application Ser. No. 15/463,551, filed Mar. 20, 2017, which claims priority under 35 U.S.C. § 119 to Korean Patent Application No. 10-2016-0125430 filed on Sep. 29, 2016 in the Korean Intellectual Property Office, the entire contents of each of which are herein incorporated by reference.

BACKGROUND

1. Technical Field

Example embodiments relate to a semiconductor device and a fabricating method thereof.

2. Description of Related Art

As one of the scaling technologies to increase the density of semiconductor devices, the multigate transistor has been suggested. In a multigate transistor, a silicon body in a fin or nanowire shape is formed on a substrate. The gate may be formed on a surface of the silicon body.

Such multi-gate transistor allows easy scaling, as it uses a three-dimensional channel. Further, current control capability can be enhanced without increasing a gate length of the multi-gate transistor. Furthermore, it is possible to effectively limit and/or suppress short channel effect (SCE) which is the phenomenon that the electric potential of a channel region is influenced by the drain voltage.

SUMMARY

Some example embodiments relate to a semiconductor device with improved operating characteristics.

Some example embodiments relate to a method for fabricating a semiconductor device with improved operating characteristic.

Features and/or effects of inventive concepts are not limited to those set forth above and other features and/or effects will be clearly understood to a person skilled in the art from the following description.

According to some example embodiments of inventive concepts, a semiconductor device includes a substrate including first and second regions, a first nanowire on the first region and spaced apart from the substrate, a first gate electrode surrounding a periphery of the first nanowire, a second nanowire on the second region and spaced apart from the substrate, a supporting pattern contacting the second nanowire and positioned under the second nanowire, and a second gate electrode extending in the second direction and surrounding the second nanowire and the supporting pattern. The second nanowire extends in a first direction and includes a first width in a second direction that intersects the first direction. The supporting pattern includes a second width that is less than the first width in the second direction According to some example embodiments of inventive concepts, a semiconductor device, includes a substrate including first and second regions, a nanosheet structure on the first region, and a fin structure on the second region. The nanosheet structure includes nanowires spaced apart from each other by a first distance on the substrate and a first gate electrode surrounding a periphery of the nanowires. The fin structure includes supporting patterns on the substrate, channel patterns formed on the supporting patterns, and a second gate electrode on the channel patterns. The channel patterns include a width that is greater than a width of the supporting patterns. The channel patterns are spaced apart from each other by a second distance that is equal to the first distance. The supporting pattern includes a width in the second direction that is less than a width of the second nanowire in the second direction According to some example embodiments of inventive concepts, a semiconductor device includes a substrate including a first region and a second region, a first gate electrode on the first region, a first nanowire on the first region and the first nanowire extending in a first direction and being spaced apart from a top surface of the first region, a first gate electrode surrounding a periphery of the first nanowire, a first gate insulating film between the first gate electrode and the first nanowire, second nanowire on the second region and the second nanowire extending in the first direction and being spaced apart from a top surface of the second region, a supporting pattern between the second nanowire and the second region, a second gate electrode on the second nanowire, and a second gate insulating film between the second nanowire and the second gate electrode.

BRIEF DESCRIPTION OF THE DRAWINGS

The above and other features and effects of inventive concepts will become more apparent to those of ordinary skill in the art by the description of the following drawings, in which.

DETAILED DESCRIPTION

Hereinafter, a semiconductor device according to some example embodiments will be described with reference to FIGS. 1 to 4.

Figure 1:
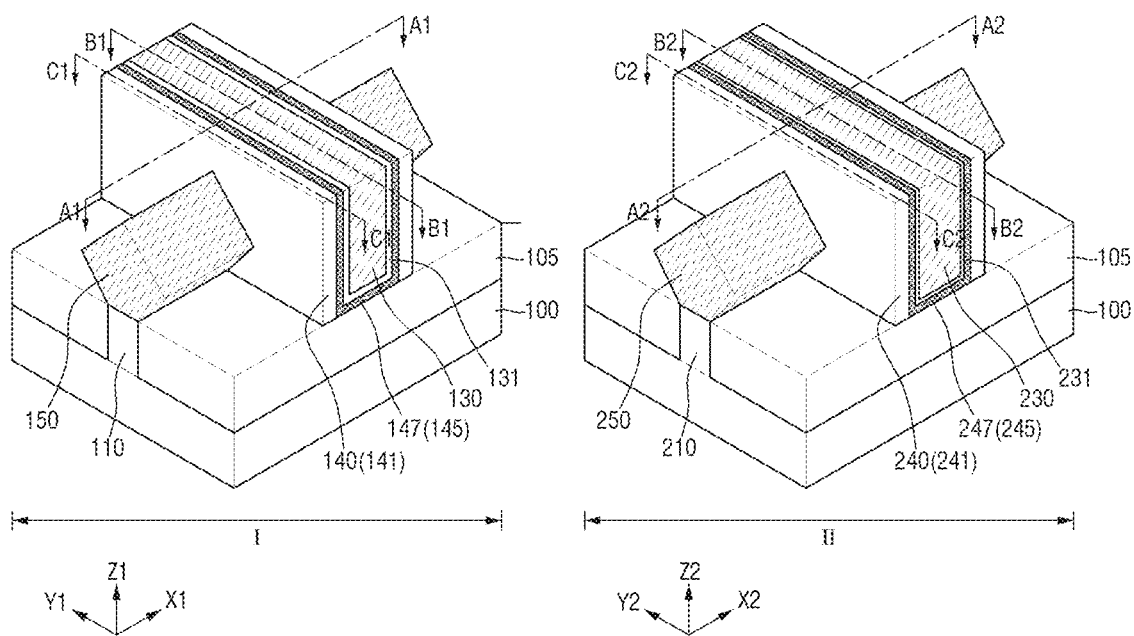
FIG. 1 is a perspective view provided to explain a semiconductor device according to some example embodiments.
Figure 2:
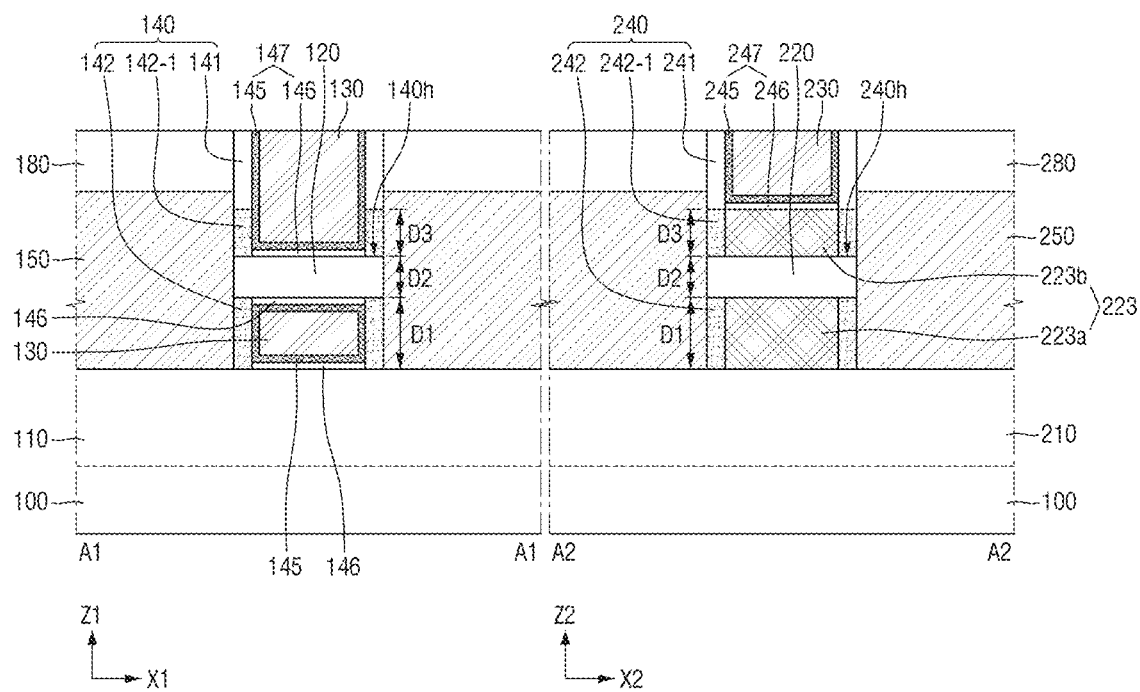
FIG. 2 are cross sectional views taken on lines A1-A1 and A2-A2 of FIG. 1.
Figure 3:
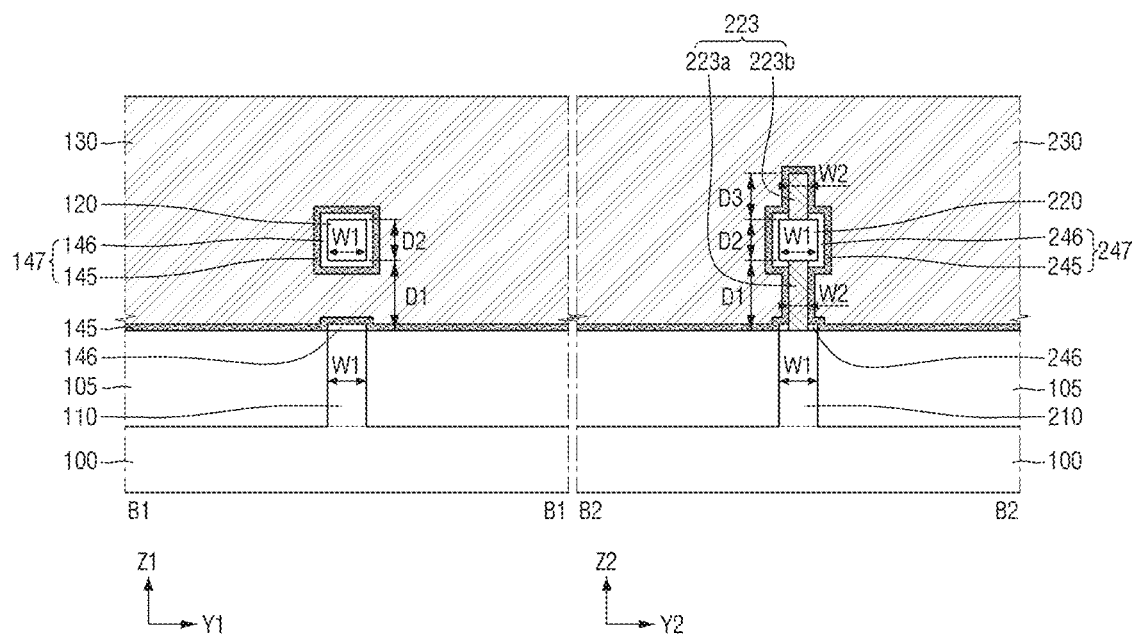
FIG. 3 are cross sectional views taken on lines B1-B1 and B2-B2 of FIG. 1.
Figure 4:
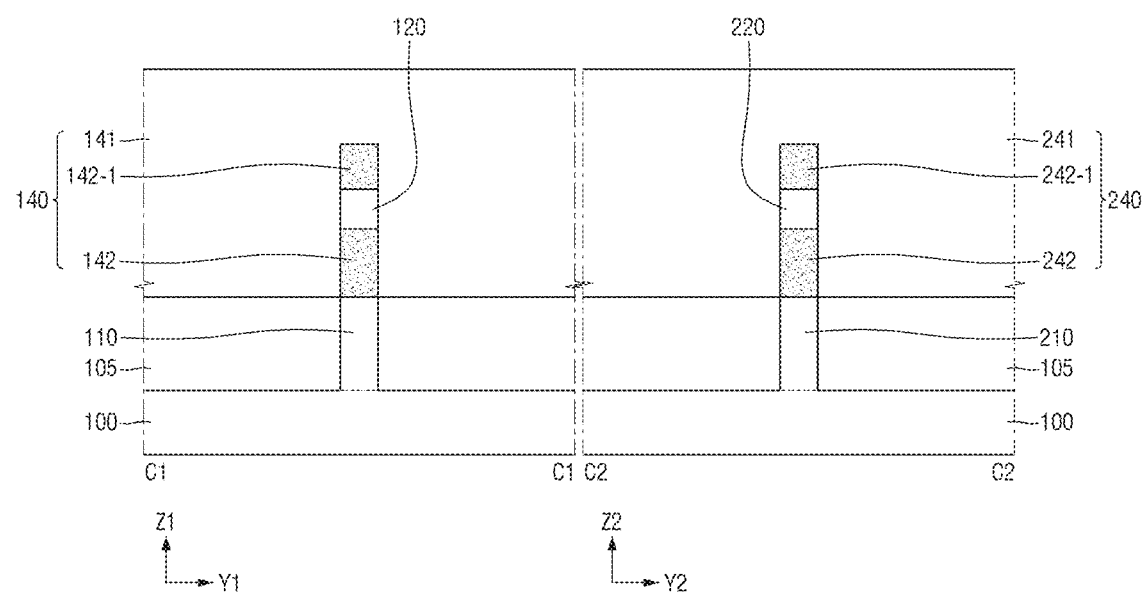
FIG. 4 are cross sectional views taken on lines C1-C1 and C2-C2 of FIG. 1.

FIG. 1 is a perspective view provided to explain a semiconductor device according to some example embodiments, and FIG. 2 are cross sectional views taken on lines A1-A1 and A2-A2 of FIG. 1. FIG. 3 are cross sectional views taken on lines B1-B1 and B2-B2 of FIG. 1, and FIG. 4 are cross sectional views taken on lines C1-C1 and C2-C2 of FIG. 1.

Referring to FIGS. 1 to 4, a semiconductor device according to some example embodiments may include a substrate 100 including a first region I and a second region II.

The substrate 100 may be, for example, a bulk silicon or a silicon-on-insulator (SOI). Alternatively, the substrate 100 may include a material different from silicon, for example, silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The first region I and the second region II on the substrate 100 may be the regions adjacent to each other, or the regions spaced apart from each other. That is, as long as the condition that the regions be formed on the same substrate is satisfied, the locations of the first region I and the second region II are not limited.

The first region I on the substrate 100 may be represented by a first direction X1, a second direction Y1, and a third direction Z1, which are perpendicular to each other. Meanwhile, the second region II may be represented by a fourth direction X2, a fifth direction Y2, and a sixth direction Z2, which are perpendicular to each other. The first to third directions and the fourth to sixth directions of the first region I and the second region II may be the same direction as each other, or different directions from each other.

The first region I may include a first fin-type pattern 110, a first nanowire 120, a first gate electrode 130, a first gate spacer 140, a first source/drain 150, and so on.

The first fin-type pattern 110 may protrude from the substrate 100. The first fin-type pattern 110 may elongate in the first direction X1. That is, the first fin-type pattern 110 may include a long side extended in the first direction X1, and a short side extended in the second direction Y1.

The first fin-type pattern 110 may be formed by partially etching the substrate 100, and may include an epitaxial layer grown from the substrate 100. The first fin-type pattern 110 may include an element semiconductor material such as silicon or germanium, for example. Further, the first fin-type pattern 110 may include a compound semiconductor such as, for example, IV-IV group compound semiconductor or III-V group compound semiconductor.

For example, take the IV-IV group compound semiconductor for instance, the first fin-type pattern 110 may be a binary compound or a ternary compound including, for example, at least two or more of carbon (C), silicon (Si), germanium (Ge), and tin (Sn), or the above-mentioned binary or ternary compound doped with IV group element.

Take III-V group compound semiconductor for instance, the fin-type pattern 110 may be a binary compound, ternary compound or quaternary compound which is formed as a III group element which may be at least one of aluminum (Al), gallium (Ga), and indium (In), is combined with a V group element which may be one of phosphorus (P), arsenic (As) and antimony (Sb).

In the following description, it is assumed that the first fin-type pattern 110 of a semiconductor device according to example embodiments includes silicon.

A field insulating film 105 may at least partially surround the sidewall of the first fin-type pattern 110. The first fin-type pattern 110 may be defined by the field insulating film 105. The field insulating film 105 may include, for example, one of oxide film, nitride film, oxynitride film, or a combination thereof.

As illustrated in FIG. 1, the sidewall of the first fin-type pattern 110 may be entirely surrounded by the field insulating film 105, but note that this is only for illustrative purpose, and example embodiments are not limited thereto.

The first nanowire 120 may be formed on the substrate 100, while being spaced apart from the first fin-type pattern 110. The first nanowire 120 may be extended in the first direction X1. Specifically, the first nanowire 120 may be formed on the first fin-type pattern 110, while being spaced apart from the first fin-type pattern 110.

The first nanowire 120 may be overlapped with the fin-type pattern 110 in a third direction Z1. The first nanowire 120 may be formed on the fin-type pattern 110, rather than being formed on the field insulating film 105.

The first nanowire 120 may be used as a channel region for the transistor. The materials for the first nanowire 120 may vary depending on whether the semiconductor device is a PMOS or an NMOS, but example embodiments are not limited thereto. In the semiconductor device according to example embodiments, it is assumed that the first nanowires 120 each include silicon.

The first gate electrode 130 may be formed on the field insulating film 105 and the first fin-type pattern 110. The first gate electrode 130 may extend in a second direction Y1. The first gate electrode 130 may be so formed as to surround the periphery of the first nanowire 120 that is spaced apart from an upper surface of the first fin-type pattern 110. The first gate electrode 130 may also be formed in a space defined between the first nanowire 120 and the first fin-type pattern 110.

The first gate electrode 130 may include a conductive material. As illustrated, the first gate electrode 130 may be a single layer, but not limited thereto. That is, the first gate electrode 130 may include a work function adjustment layer which adjusts work function, and a filling conductive layer which fills a space formed by the work function adjustment layer.

For example, the first gate electrode 130 may include at least one of TiN, WN, TaN, Ru, TiC, TaC, Ti, Ag, Al, TiAl, TiAlN, TiAlC, TaCN, TaSiN, Mn, Zr, W, Al and Co. Alternatively, the first gate electrode 130 may each be formed of non-metal element such as Si, SiGe, and so on. For example, the gate electrode 130 described above may be formed by replacement process, but not limited thereto.

The first gate spacer 140 may be formed on both sidewalls of the first gate electrode 130 that are extended in the second direction Y1. The first gate spacer 140 may be formed on either side of the first nanowire 120, while facing each other. The first gate spacer 140 may each include a through hole 140h (FIG. 2).

The first nanowire 120 may be passed through the first gate spacer 140 via a first through hole 140h. The first gate spacer 140 may be entirely in contact with a periphery of a portion of the side surface of the first nanowire 120. That is, the inner wall of the first through hole 140h may be in contact with a portion of outer surface periphery of the first nanowire 120.

The first gate spacer 140 may include a first outer spacer 141, a first inner spacer 142, and a second inner spacer 142-1. The first outer spacer 141 may be in direct contact with the first inner spacer 142 and the second inner spacer 142-1. The first inner spacer 142 may be disposed between the upper surface of the first fin-type pattern 110 and the first nanowire 120, and may be in surface contact with the upper surface of the first fin-type pattern 110. The second inner spacer 142-1 may be disposed on an upper surface of the first nanowire 120, and may be surrounded by the first outer spacer 141.

On a plane including the second direction Y1 and the third direction Z1, the first inner spacer 142 may be surrounded by the first nanowire 120, the first outer spacer 141, and the fin-type pattern 110.

On a plane including the second direction Y1 and the third direction Z1, the second inner spacer 142-1 may be surrounded by the first nanowire 120 and the first outer spacer 141.

The first through hole 140h of the first gate spacer 140 may be defined by the first outer spacer 141, the first inner spacer 142, and the second inner spacer 142-1. An end of the first nanowire 120 may be in contact with the first outer spacer 141, the first inner spacer 142, and the second inner spacer 142-1.

The first inner spacer 142 and the second inner spacer 142-1 may include the same material as each other. The first outer spacer 141, the first inner spacer 142, and the second inner spacer 142-1 may include the different material from one another. That is, the dielectric constant of the material included in the first outer spacer 141 may be a first dielectric constant, and the dielectric constant of the material included in the first inner spacer 142 may be a second dielectric constant.

In the semiconductor device according to some example embodiments, the first dielectric constant of the material included in the first outer spacer 141 may be greater than the second dielectric constant of the material included in the first inner spacer 142 and the second inner spacer 142-1. It is possible to reduce the fringing capacitance between the first gate electrode 130 and the first source/drain 150 by having the second dielectric constant lower than the first dielectric constant.

For example, the first outer spacer 141 may include at least one of silicon nitride (SiN), silicon oxynitride (SiON), silicon oxide (SiO2), silicon oxycarbonitride (SiOCN), or a combination thereof. The first inner spacer 142 and the second inner spacer 142-1 may include low-k material, for example. The low-k material may be the material that has a lower dielectric constant than the silicon oxide.

A first gate insulating film 147 may be formed between the first nanowire 120 and the first gate electrode 130. Further, the first gate insulating film 147 may also be formed between the field insulating film 105 and the first gate electrode 130, and between the first inner spacer 142, second inner spacer 142-1, and the first gate electrode 130.

For example, the first gate insulating film 147 may include a first interfacial layer 146 and a first high-k insulating film 145, but not limited thereto. That is, the first interfacial layer 146 of the first gate insulating film 147 may be omitted depending on a material of the first nanowire 120, and so on.

Because the first interfacial layer 146 may be formed on a periphery of the first nanowire 120, the interfacial layer 146 may be formed between the first nanowire 120 and the first gate electrode 130, and between the first fin-type pattern 110 and the first gate electrode 130.

When the first nanowire 120 includes silicon, the first interfacial layer 146 may include silicon oxide film. At this time, the first interfacial layer 146 may be formed on a periphery of the first nanowire 120, but may not be formed along the sidewalls of the first inner spacer 142, the second inner spacer 142-1, and the first outer spacer 141.

Meanwhile, the first high-k insulating film 145 may be formed between the first nanowire 120 and the first gate electrode 130, between the first inner spacer 142 and the first gate electrode 130, between the second inner spacer 142-1 and the first gate electrode 130, between the field insulating film 105 and the first gate electrode 130, and between the first outer spacer 141 and the first gate electrode 130.

The first high-k insulating film 145 may include a high-k material having a higher dielectric constant than silicon oxide film. For example, the high-k material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but not limited thereto.

As described above, when the first interfacial layer 146 is omitted, the first high-k insulating film 145 may include not only the high-k material, but also silicon oxide film, silicon oxynitride film, or silicon nitride film, and so on.

The first gate insulating film 147 may be formed along the periphery of the first nanowire 120. The first gate insulating film 147 may be formed along the upper surface of the field insulating film 105 and the upper surface of the first fin-type pattern 110. Additionally, the first gate insulating film 147 may be formed along the sidewalls of the first inner spacer 142, the second inner spacer 142-1, and the first outer spacer 141.

A first source/drain 150 may be formed on either side of the first gate electrode 130. The first source/drain 150 may be formed on the first fin-type pattern 110. The first source/drain 150 may include an epitaxial layer formed on an upper surface of the first fin-type pattern 110.

An outer circumference of the first source/drain 150 may take on a variety of shapes. For example, the outer circumference of the first source/drain 150 may be at least one of diamond, circle, rectangle, and octagon shapes. FIG. 1 illustrates a diamond shape (or pentagon or hexagon shape) for an example.

The first source/drain 150 may be directly connected to the first nanowire 120 used as the channel region. That is, the first source/drain 150 may be directly connected to the first nanowire 120 that is passed through the first through hole 140h of the first gate spacer 140.

However, the first source/drain 150 may not be in direct contact with the first gate insulating film 147. The first gate spacer 140 may be positioned between the first source/drain 150 and the first gate insulating film 147. More specifically, because one sidewall of the first inner spacer 142 and the second inner spacer 142-1 may be in contact with the first gate insulating film 147, while the other sidewall of the first inner spacer 142 and the second inner spacer 142-1 may be in contact with the first source/drain 150, the first source/drain 150 and the first gate insulating film 147 may not be in contact with each other between the first nanowire 120 and the substrate 100. Further, since the outer spacer 141 is in contact with the uppermost portion of the first nanowire 120, the first source/drain 150 and the first gate insulating film 147 may not be in contact with each other over the first nanowire 120.

A first interlayer insulating film 180 may be formed on the first source/drain 150, the first gate spacer 140, and the field insulating film 105.

The first interlayer insulating film 180 may include at least one of low-k material, oxide film, nitride film, and oxynitride film. For example, the low-k material may be flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), high density plasma (HDP) oxide, plasma enhanced oxide (PEOX), flowable CVD (FCVD) oxide, or a combination thereof.

The device formed in the second region II may be similar to that in the first region I. Specifically, the second region II may include a second fin-type pattern 210, a second nanowire 220, a second gate electrode 230, a supporting pattern 223, a second gate spacer 240, and a second source/drain 250.

The second fin-type pattern 210, the second nanowire 220, the second gate electrode 230, the second gate spacer 240, and the second source/drain 250 may have same or similar characteristics as the first fin-type pattern 110, the first nanowire 120, the first gate electrode 130, the first gate spacer 140, and the first source/drain 150 described above.

Further, a second interlayer insulating film 280, a second through hole 240h1, a second interfacial layer 246, a second high-k insulating film 245, a third inner spacer 242, a fourth inner spacer 242-1, and a second outer spacer 241 may also have same or similar characteristics as the first interlayer insulating film 180, the first interfacial layer 146, the first high-k insulating film 145, the first inner spacer 142, the second inner spacer 142-1, and the first outer spacer 141, respectively.

Therefore, for convenience of explanation, the second region II will be described mainly with respect to differences from the first region I.

The supporting pattern 223 may be positioned between the substrate 100 and the second nanowire 220, and between the second nanowire 220 and the second gate electrode 230. That is, the supporting pattern 223 may be positioned below and above the second nanowire 220. The supporting pattern 223 may be in direct contact with the upper surface and the lower surface of the second nanowire 220.

The supporting pattern 223 may include a supporting pattern 223 and a second supporting pattern 223b. The supporting pattern 223 may be positioned under the second nanowire 220. The second supporting pattern 223b may be positioned above the second nanowire 220. Accordingly, the supporting pattern 223 and the second supporting pattern 223b may be positioned opposite each other with respect to the second nanowire 220. In addition, the supporting pattern 223 and the second supporting pattern 223b may be spaced apart from each other by the second nanowire 220.

The supporting pattern 223 may be in contact with the third inner spacer 242 and the fourth inner spacer 242-1. Specifically, the supporting pattern 223a may be in contact with the third inner spacer 242, and the second supporting pattern 223b may be in contact with the fourth inner spacer 242-1.

Referring to FIG. 2, the supporting pattern 223 may be formed in the second region II, at a location corresponding to a portion of the location where the first gate electrode 130 and the first gate insulating film 147 are formed in the first region I. That is, the supporting pattern 223a may be formed in the space between the substrate 100 and the second nanowire 220 by the first height D1 at which the third inner spacer 242 is formed, and the second supporting pattern 223b may be formed in the space where a fourth inner spacer 242-1 by the third height D3 on the nanowire 220 is formed. However, the thickness of the first nanowire 120 may be a second height D2 equal to the thickness of the second nanowire 220.

That is, a nanosheet structure of the first gate electrode 130, the first nanowire 120, and the first gate insulating film 147 may be formed in the first region I, and the fin structure of the second gate electrode 230, the second nanowire 220, the second gate insulating film 247, and the supporting pattern 223 may be formed in the second region II. In an example, the vertical positions of the first nanowire 120 and the second nanowire 220 may correspond to each other. That is, the vertical positions of the first nanowire 120 and the second nanowire 220 based on the substrate 100 may be identical to each other.

The second nanowire 220 may be referred to as a channel pattern because it is used as a channel region of a transistor. That is, the fin structure may be a structure in which the substrate 100, the second fin-type pattern 210, the supporting pattern 223, and the channel pattern 220 are connected to each other.

Referring to FIG. 3, both the width of the first nanowire 120 in the second direction Y1 and the width of the second nanowire 220 in the fifth direction Y2 may be the same as the first width W1. This is because the first nanowire 120 and the second nanowire 220 in the first region I and the second region II are formed in the same process. In this case, "same" is a concept including a fine irregularity that may be caused along the process.

The first nanowire 120 and the first fin-type pattern 110 are formed using the same mask and therefore may have the same width. The second nanowire 220 and the second fin-type pattern 210 are formed using the same mask and therefore, these may likewise have the same width. In an example, since the first nanowire 120 and the second nanowire 220 have the same width, the first nanowire 120, the first fin-type pattern 110, the second nanowire 220, the second fin-type pattern 210 may all have the same first width W1.

On the other hand, the supporting pattern 223 may have the second width W2 smaller than the first width W1 in the fifth direction Y2. That is, the supporting pattern 223 and the second supporting pattern 223b may have the second width W2 in the same fifth direction Y2. The supporting pattern 223 and the second supporting pattern 223b have a smaller width than the second fin-type pattern 210 and the second nanowire 220 because the second width W2 is smaller than the first width W1.

That is, the lower surface of the supporting pattern 223 may be in contact with the upper surface of the second fin-type pattern 210, and irregularities may be formed by a difference between the first width W1 and the second width W2. Similarly, the upper surface of the supporting pattern 223 and the lower surface of the second supporting pattern 223b may be in contact with the lower surface and the upper surface of the second nanowire 220, respectively, and irregularities may be formed by the difference between the first width W1 and the second width W2.

The second interfacial layer 246 may be formed only on a portion of the upper surface of the second fin-type pattern 210 by the supporting pattern 223. Likewise, the second interfacial layer 246 may be formed only on the entire side surface, a portion of the upper surface, and a portion of the lower surface of the second nanowire 220 by the supporting pattern 223. This may be due to the second interfacial layer 246 being formed by natural oxidation at the silicon surface.

In some example embodiments of the present disclosure, the second interfacial layer 246 may be a deposited oxide film. In this case, the second interfacial layer 246 may be formed on the surfaces of the second nanowire 220 and the second fin-type pattern 210 as well as on the surface of the supporting pattern 223.

The supporting pattern 223 may include a material having an etch selectivity to the second nanowire 220 and the second fin-type pattern 210. For example, the supporting pattern 223 may include SiGe. Thus, a Si/SiGe structure may be formed, in which the second nanowire 220 may include Si and the supporting pattern 223 may include SiGe.

Alternatively, the semiconductor device according to some example embodiments may include a SiGe/Si structure in which the second nanowire 220 and the second fin-type pattern 210 include SiGe and the supporting pattern 223 includes Si.

In the semiconductor device according to some example embodiments, the first region I may be an active region and the second region II may be a dummy region. Since the first region I and the second region II are positioned in the same device, the structures of the first region I and the second region II have an influence on the durability of the regions. That is, when the durability of the second region II is high, the durability of the first region I may also be increased.

When a process involves removing the sacrificial layer formed at the bottom of the nanowire structure such as the nanosheet and the nanowire and subsequently forming the gate electrode in the empty space, the durability of the device is inevitably weak.

In order to limit and/or prevent this, the semiconductor device according to some example embodiments may increase the durability of the device in the process by forming active transistors in the first region I which is an active region, in a general manner, while not removing, e.g., while leaving the sacrificial layer as the supporting pattern 223 in a second region II which is an unused dummy region.

That is, the supporting pattern 223 may support the second nanowires 220 to enhance the durability of the transistor structure including the second nanowires 220, and also enhance the durability of the transistor structure connected thereto, including the first nanowires 120 of the first region I.

For this, a method for fabricating a semiconductor device according to some example embodiments includes performing an ion implant on a sacrificial layer to increase the etch rate of the sacrificial layer to form the supporting pattern 223. At this time, the impurity concentration of the second gate electrode 230 may be higher than that of the first gate electrode 130 by the ion implant. The impurities may include at least one of phosphorus or boron.

Accordingly, lifting of the nanowire may be limited and/or prevented in the process of removing the sacrificial layer. As a result, the completed semiconductor device can have significantly enhanced operating performance.

In the semiconductor device according to some example embodiments, both the first region I and the second region II may be active regions actually used.

When the first region I and the second region II are both active regions, the conductivity types of the transistors in the first region I and the second region II may be different from each other. Specifically, the first region I may be an NMOS region in which an NMOS transistor is formed, and the second region II may be a PMOS region in which a PMOS transistor is formed.

The NMOS transistor uses an electron as a carrier whereas the PMOS transistor uses a hole as a carrier. Accordingly, the surface of the channel region where the mobility of each carrier is increased may be different from each other.

That is, electrons in the NMOS region have the highest mobility on the top and bottom surfaces of the channel. Accordingly, the nanowire or nanosheet structure in which the upper surface and lower surface of the channel are exposed most may be an optimal structure having the highest mobility.

On the other hand, holes in the PMOS region have the highest mobility on the side surface of the channel. Accordingly, the fin structure having the maximized area of the side surface of the channel and not exposing the upper surface and lower surface of the channel may be an optimal structure having the highest mobility.

Therefore, the semiconductor device according to some example embodiments may have the NMOS region as the first region I having the nanosheet structure and the PMOS region as the second region II having the fin structure.

In the semiconductor device according to some example embodiments, when the first region I and the second region II are both active regions, the first region I and the second region II may be a low voltage region and a high voltage region, respectively.

The "low voltage region" as used herein may mean a region where a transistor with a relatively low operating voltage is formed, and a "high voltage region" may mean a region where a transistor with a relatively high operating voltage is formed.

By way of example, the "low voltage region" may mean a region where a transistor having an operating voltage of less than 1 V is formed (e.g., greater than 0 V and less than 1V, but not limited thereto), and a "high voltage region" may mean a region where a transistor having an operating voltage of 1 V or higher is formed. However, example embodiments are not limited to the example given above. The operating voltage of a transistor may tuned using various methods, for example, such as ion implantation and/or adjusting a thickness of the gate insulating film.

A hot carrier effect may occur in the high voltage region having the high transistor operating voltage.

Generally, when the channel length is shortened as the degree of integration increases, the maximum electric field applied to the carriers at the drain junction is increased. The result is that the carriers may become hot carriers with kinetic energy strong enough to cause impact ionization. Such hot carriers may generate a secondary electron-hole pair, and the characteristics of the transistor may be degraded by the generated secondary electron-hole pair. According to the present disclosure, a transistor to which a relatively high voltage is applied may be formed in the second region II, which may be vulnerable to such hot carrier effect.

Accordingly, the semiconductor device according to some example embodiments may be configured such that the second nanowire 220, that is, the channel pattern 220 is connected to the supporting pattern 223 in the second region II where the hot carrier effect is likely to occur so that the second fin-type pattern 210 and the substrate 100 may be electrically connected to each other. As a result, the charges generated by the hot carriers may be easily discharged to the substrate 100

As a result, the semiconductor device according to some example embodiments may limit and/or prevent the hot carrier effect in the high voltage region and the semiconductor device with excellent operation performance may be provided.

Hereinbelow, a semiconductor device according to some example embodiments will be explained with reference to FIGS. 1, 2, 4 and 5. For convenience of explanation, differences that are not explained above will be mainly explained below.

Figure 5:
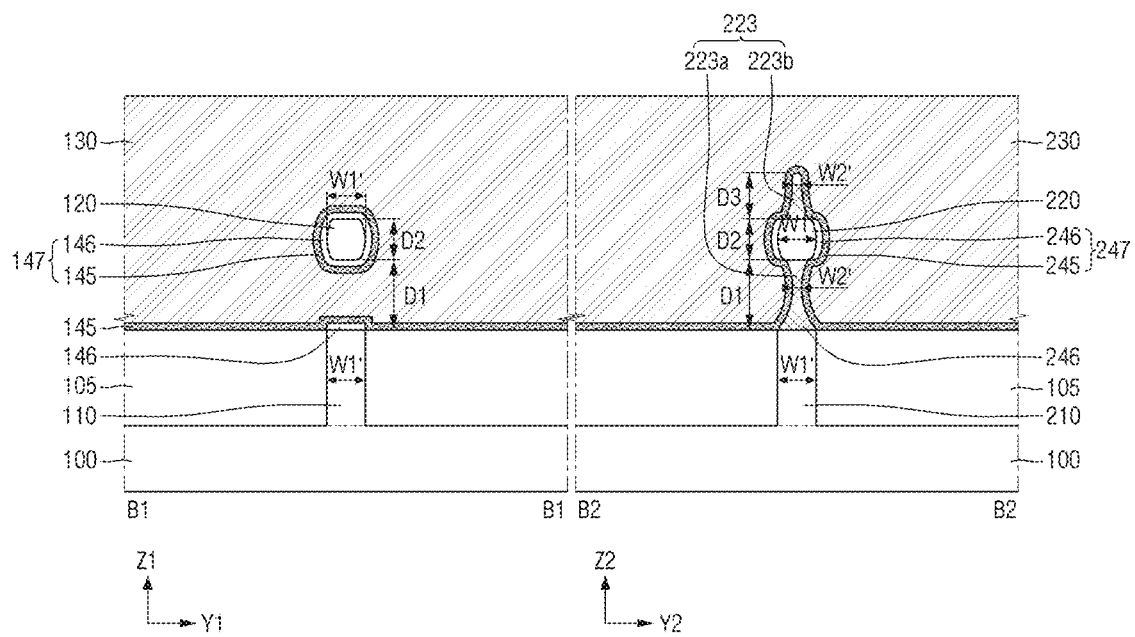
FIG. 5 is a cross sectional view provided to explain a semiconductor device according to some example embodiments.

FIG. 5 is a cross sectional view provided to explain a semiconductor device according to some example embodiments.

Referring to FIGS. 1, 2, 4 and 5, the side surfaces of the first nanowire 120 and the second nanowire 220 of the semiconductor device according to some example embodiments may be convex shape, and the side surface of the supporting pattern 223 may be concave shape.

This may be caused due to the removal of a portion of the ends of the first nanowire 120 and the second nanowire 220 by the etching process. In addition, the supporting pattern 223 may also have a concave shape by etching only a portion of the side surface. This may be attributed to the fact that the etch rate at the center portion is higher than at the end portion of the supporting pattern 223.

The second gate insulating film 247 may be formed conformally along the side surfaces of the second nanowire 220 and the supporting pattern 223. In addition, since the second fin-type pattern 210 and the second nanowire 220 are not spaced apart from each other, the second high-k insulating film 245 of the second gate insulating film 247 may not be separated, but connected as one single film.

Both the width of the first nanowire 120 in the second direction Y1 and the width of the second nanowire 220 in the fifth direction Y2 may all be the same as the third width W1'. This is because the first nanowire 120 and the second nanowire 220 in the first region I and the second region II are formed in the same process. In this case, "same" is a concept including a fine irregularity that may be caused along the process.

Further, since the first nanowire 120, the first fin-type pattern 110, the second nanowire 220, and the second fin-type pattern 210 have the same width, the first nanowire 120, the first fin-type pattern 110, the second nanowire 220, and the second fin-type pattern 210 may all have the same third width W1'.

On the other hand, the supporting pattern 223 may have the fourth width W2' smaller than the third width W1' in the fifth direction Y2. That is, the supporting pattern 223 and the second supporting pattern 223b may have the fourth width W2' in the same fifth direction Y2. The supporting pattern 223 and the second supporting pattern 223b have a smaller width than the second fin-type pattern 210 and the second nanowire 220 because the fourth width W2' is smaller than the third width W1'.

In the semiconductor device according to some example embodiments, the supporting pattern 223 and the second supporting pattern 223b may have different widths. This may naturally appear according to the etching process.

Hereinbelow, a semiconductor device according to some example embodiments will be explained with reference to FIGS. 1 and 6 to 8. For convenience of explanation, differences that are not explained above will be mainly explained below.

Figure 6:
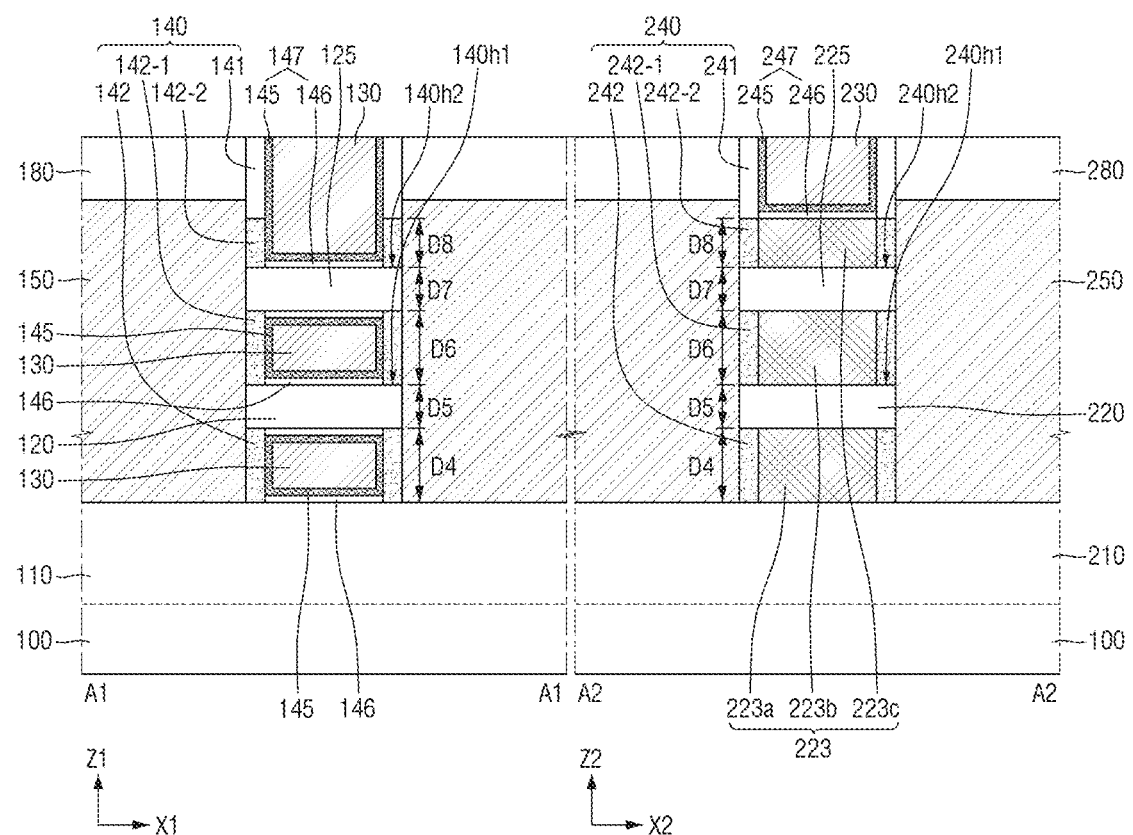
FIGS. 6 to 8 are cross sectional views provided to explain a semiconductor device according to some example embodiments.
Figure 7:
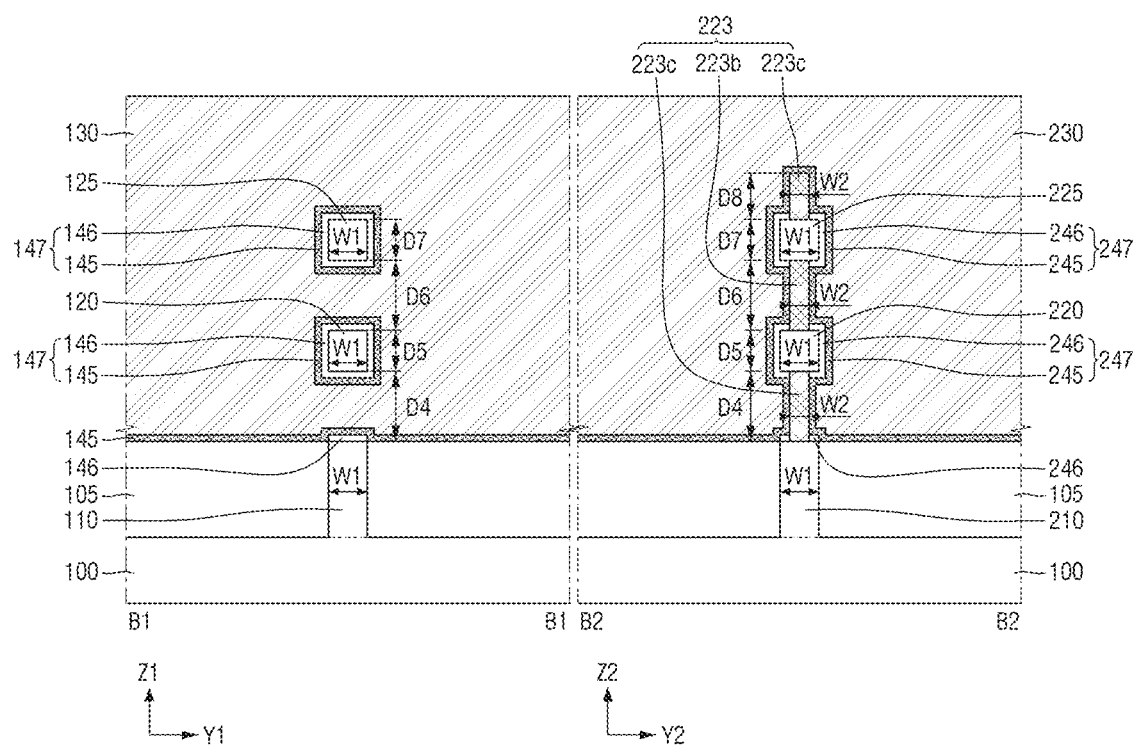
Figure 8:
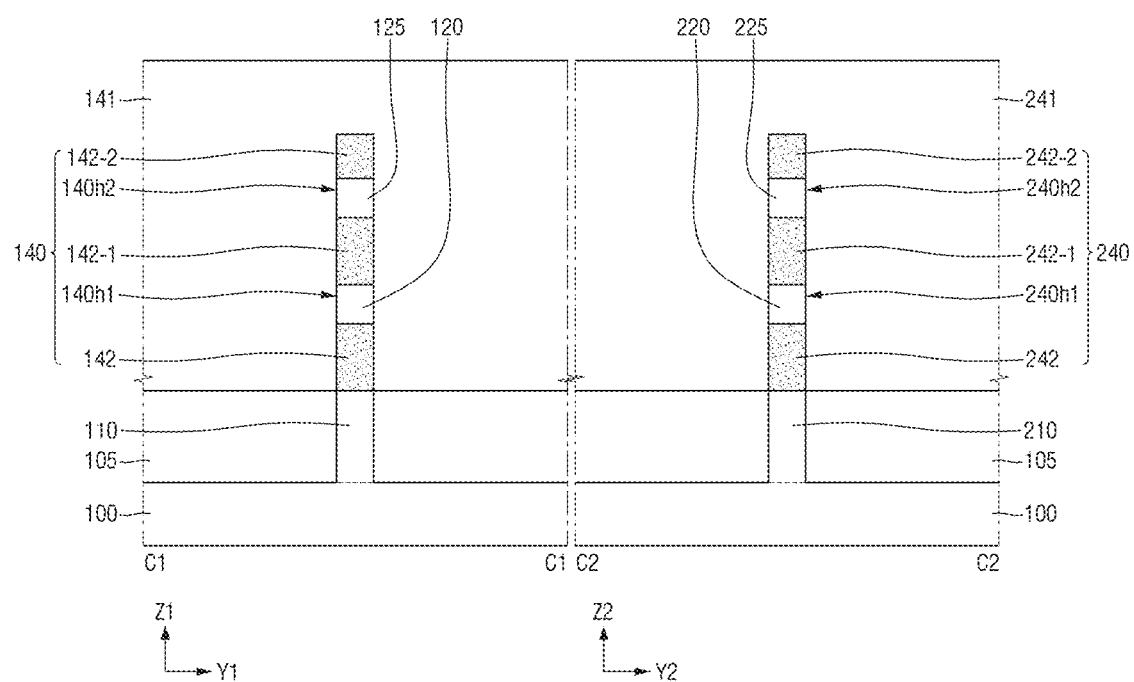

FIGS. 6 to 8 are cross sectional views provided to explain a semiconductor device according to some example embodiments. Specifically, FIG. 6 are cross sectional views taken on lines A1-A1 and A2-A2 of FIG. 1. FIG. 7 are cross sectional views taken on lines B1-B1 and B2-B2 of FIG. 1. FIG. 8 are cross sectional views taken on lines C1-C1 and C2-C2 of FIG. 1. Illustrations in FIGS. 1 and 6 to 8 may be at different scales.

Referring to FIGS. 1 and 6 to 8, a semiconductor device according to some example embodiments may additionally include a third nanowire 125 and a fourth nanowire 225.

The third nanowire 125 may be formed on the substrate 100, while being spaced apart from the substrate 100. The third nanowire 125 may extend in the first direction X1.

The third nanowire 125 may be spaced apart from the substrate 100 further than the first nanowire 120. That is, the height from the upper surface of the first fin-type pattern 110 to the third nanowire 125 is greater than that from the upper surface of the first fin-type pattern 110 to the first nanowire 120.

The third nanowire 125 may be overlapped with the first fin-type pattern 110. The third nanowire 125 may be formed on the first fin-type pattern 110, rather than being formed on the field insulating film 105.

The third nanowire 125 may be used as a channel region for the transistor. Accordingly, the third nanowire 125 may include the same material as the first nanowire 120.

The first gate electrode 130 may be formed so as to surround the periphery of the third nanowire 125. The first gate electrode 130 may also be formed in a space defined between the first nanowire 120 and the third nanowire 125.

The first gate spacers 140 may be disposed on both ends of the first nanowire 120 and on both ends of the third nanowire 125. The first gate spacer 140 may each include a plurality of first through holes 140h1 and 140h2.

The third nanowire 125 may be passed through the first gate spacer 140. The third nanowire 125 may pass through one of a plurality of first through holes 140h1 and 140h2. The periphery of the end of the third nanowire 125 may be entirely in contact with the first gate spacer 140.

The third nanowire 125 may be aligned with the first nanowire 120. The third nanowire 125 may be overlapped with the first nanowire 120 in the third direction Z1. The first nanowire 120 and the third nanowire 125 may have the same length in the first direction X1. However, example embodiments are not limited to the example given above.

The first inner spacer 142 may be disposed between the upper surface of the first fin-type pattern 110 and the first nanowire 120. The second inner spacer 142-1 may be disposed between the first nanowire 120 and the third nanowire 125. The fifth inner spacer 142-2 may be disposed between the third nanowire 125 and the first outer spacer 141.

The second region II may also be added with the fourth nanowire 225 and the sixth inner spacer 242-2, as compared to the embodiments of FIGS. 2 to 4. That is, the fourth nanowire 225 and the sixth inner spacer 242-2 may be the same as the third nanowire 125 and the fifth inner spacer 142-2 in the first region I.

The first source/drain 150 may be directly connected to the third nanowire 125 used as the channel region. That is, the first source/drain 150 may be directly connected to the first nanowire 120 and the third nanowire 125 that are passed through the first through holes 140h1 and 140h2 of the first gate spacer 140. The second source/drain 250 may likewise be directly connected to the first nanowire 120 and the third nanowire 125 that are passed through the second through holes 240h1 and 240h2 of the second gate spacer 240.

The supporting pattern 223 may include a first supporting pattern 223a, a second supporting pattern 223b, and a third supporting pattern 223c. The first supporting pattern 223a may be formed between the second fin-type pattern 210 and the second nanowire 220. The second supporting pattern 223b may be formed between the second nanowire 220 and the fourth nanowire 225. The third supporting pattern 223c may be formed on the fourth nanowire 225.

The supporting pattern 223 may be formed in the second region II, at a location corresponding to a portion of the location where the first gate electrode 130 and the first gate insulating film 147 are formed in the first region I. That is, the first supporting pattern 223a may be formed in the space between the substrate 100 and the second nanowire 220 by the fourth height D4 at which the third inner spacer 242 is formed, and the second supporting pattern 223b may be formed in the space between the second nanowire 220 and the fourth nanowire 225 by the sixth height D6 at which the fourth inner spacer 242-1 is formed. Further, the third supporting pattern 223c may be formed in a space where the sixth inner spacer 242-2 on the fourth nanowire 225 is formed by the eighth height D8. However, the thickness of the first nanowire 120 may be a second height D2 equal to the thickness of the second nanowire 220, and the thickness of the third nanowire 125 may be a seventh height D7 equal to the thickness of the fourth nanowire 120 of the fourth nanowire 225.

That is, a nanosheet structure of the first gate electrode 130, the first nanowire 120, the third nanowire 125, and the first gate insulating film 147 may be formed in the first region I, and the fin structure of the second gate electrode 230, the second nanowire 220, the fourth nanowire 225, the second gate insulating film 247, and the supporting pattern 223 may be formed in the second region II. At this time, the vertical positions of the first nanowire 120 and the second nanowire 220 may correspond to each other, and the vertical positions of the third nanowire 125 and the fourth nanowire 225 may correspond to each other. That is, the first nanowire 120 and the second nanowire 220 have the same vertical position with respect to the substrate 100, and the third nanowire 125 and the fourth nanowire 225 may have the same vertical position as each other.

Hereinbelow, a semiconductor device according to some example embodiments will be explained with reference to FIGS. 1, 6, 8 and 9. For convenience of explanation, differences that are not explained above will be mainly explained below.

Figure 9:
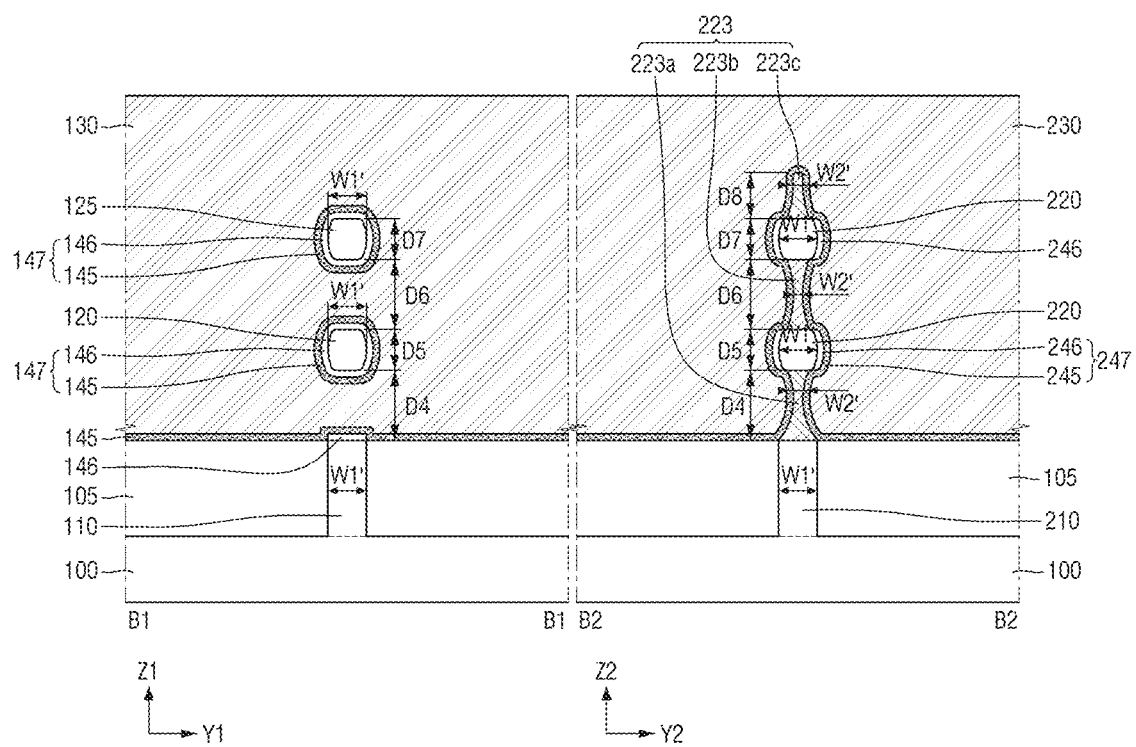
FIG. 9 is a cross sectional view provided to explain a semiconductor device according to some example embodiments.

FIG. 9 is a cross sectional view provided to explain a semiconductor device according to some example embodiments. Specifically, FIG. 9 are cross sectional views taken on lines B1-B1 and B2-B2 of FIG. 1. Illustrations of FIGS. 1 and 9 may be at different scales.

Referring to FIGS. 1, 6, 8 and 9, the side surfaces of the first nanowire 120, the second nanowire 220, the third nanowire 125, and the fourth nanowire 225 of the semiconductor device according to some example embodiments may have a convex shape, and the side surface of the supporting pattern 223 may have a concave shape.

This may be caused due to the removal of a portion of the ends of the first nanowire 120 and the second nanowire 220 by the etching process. In addition, the supporting pattern 223 may also have a concave shape by etching only a portion of the side surface. This may be attributed to the fact that the etch rate at the center portion is higher than at the end portion of the supporting pattern 223.

Both the width of the first nanowire 120 in the second direction Y1 and the width of the second nanowire 220 in the fifth direction Y2 may be the same as the third width W1'. Further, both the width of the third nanowire 125 in the second direction Y1 and the width of the fourth nanowire 225 in the fifth direction Y2 may be the same as the third width W1'.

Further, since the first nanowire 120, the first fin-type pattern 110, the second nanowire 220 and the second fin-type pattern 210 have the same width, the first nanowire 120, the first fin-type pattern 110, the second nanowire 220, the second fin-type pattern 210 may all have the same third width W1'. In this example, both the third nanowire 125 and the fourth nanowire 225 may have the same width as the third width W1'.

On the other hand, the supporting pattern 223 may have the fourth width W2' smaller than the third width W1' in the fifth direction Y2. That is, the first supporting pattern 223a, the second supporting pattern 223b, and the third supporting pattern 223c may have the fourth width W2' in the same fifth direction Y2. The supporting pattern 223, the second supporting pattern 223b, and the second supporting pattern 223c may have a smaller width than the second fin-type pattern 210, the second nanowire 220, and the fourth nanowire 225 because the fourth width W2' is smaller than the third width W1'. The width of the supporting pattern 223 may vary depending on the height.

In the semiconductor device according to some example embodiments, the first supporting pattern 223a, the second supporting pattern 223b, and the third supporting pattern 223c may have different width. This may naturally appear according to the etching process.

The semiconductor device according to some example embodiments may have a shape in which the supporting pattern 223 covers the entire upper surface of the nanowire in the second region II as shown in FIGS. 1 to 9. However, example embodiments are not limited to the example given above.

The semiconductor device according to some example embodiments may not have the supporting pattern 223 formed on the upper surface of the uppermost nanowire. This may vary depending on which is the uppermost portion of the semiconductor layers that are alternately stacked in the fabricating process. That is, although not shown, the supporting pattern 223 formed on the uppermost surface of the nanowire may not exist.

Hereinbelow, a method for fabricating a semiconductor device according to some example embodiments will be described with reference to FIGS. 1 to 4, and 10 to 30. The semiconductor device fabricated based on FIGS. 1 to 4, and 10 to 30 corresponds to the semiconductor device described above with reference to FIGS. 1 to 4.

Figure 20:
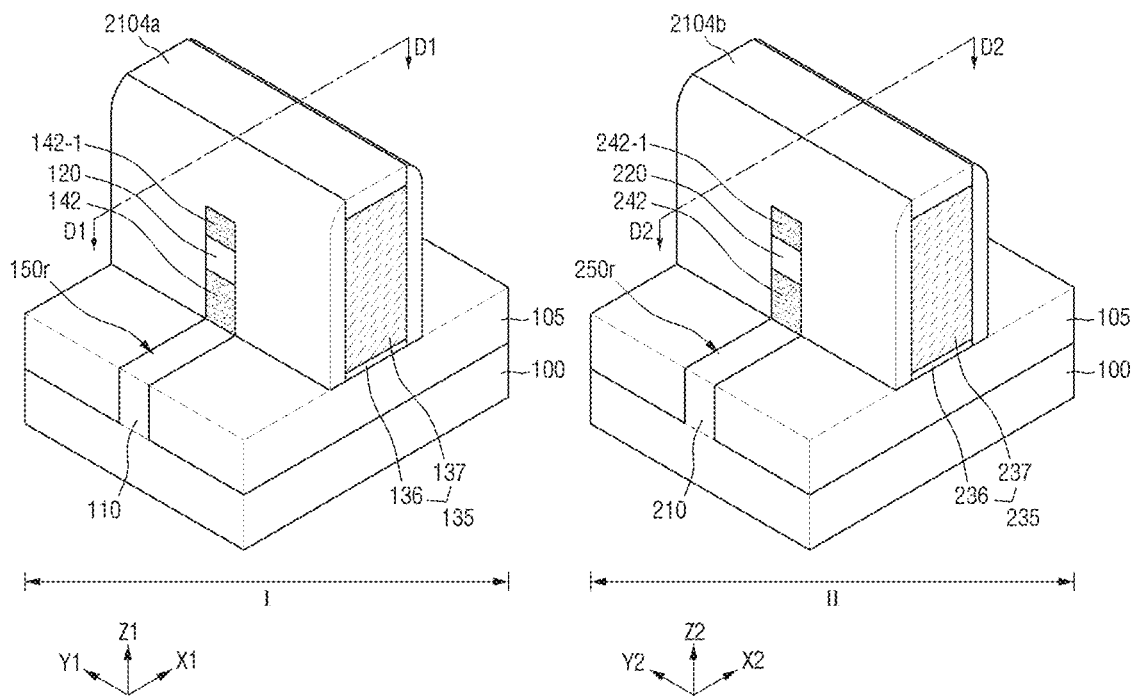
Figure 21:
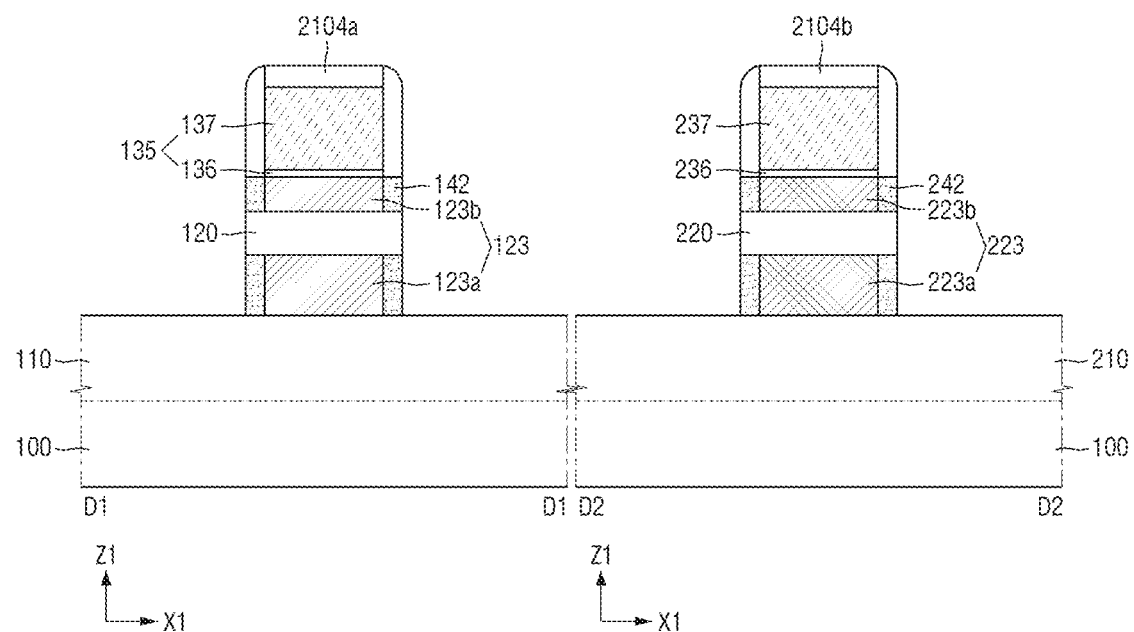
Figure 24:
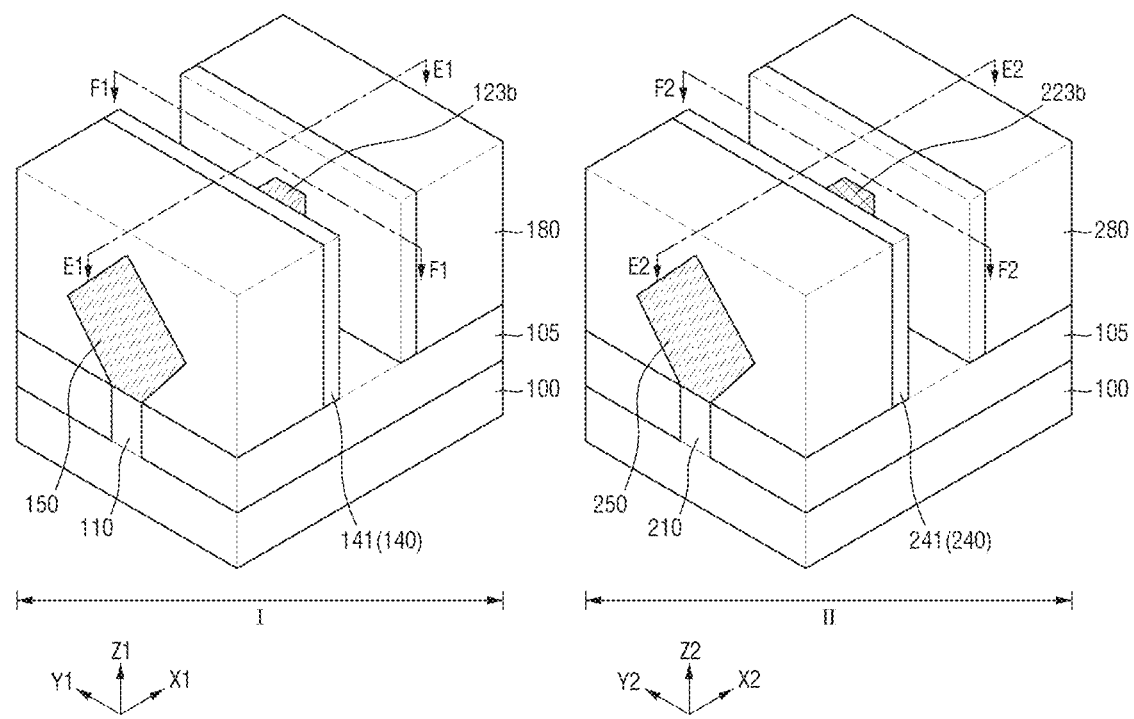
Figure 25:
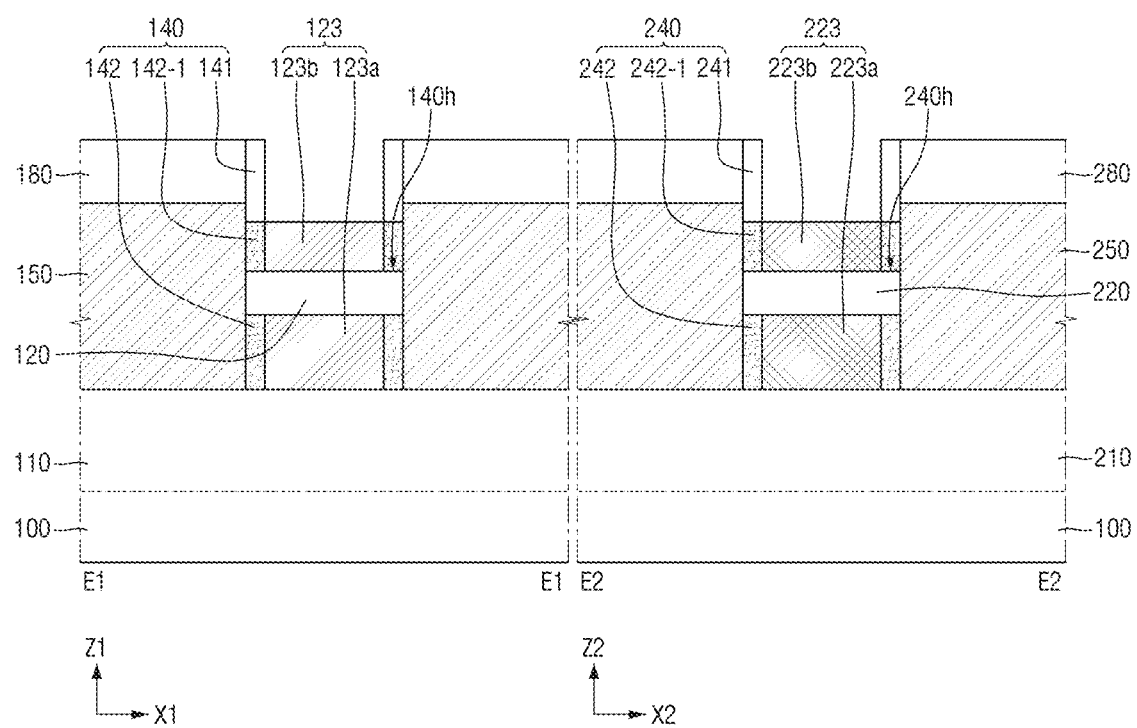
Figure 26:
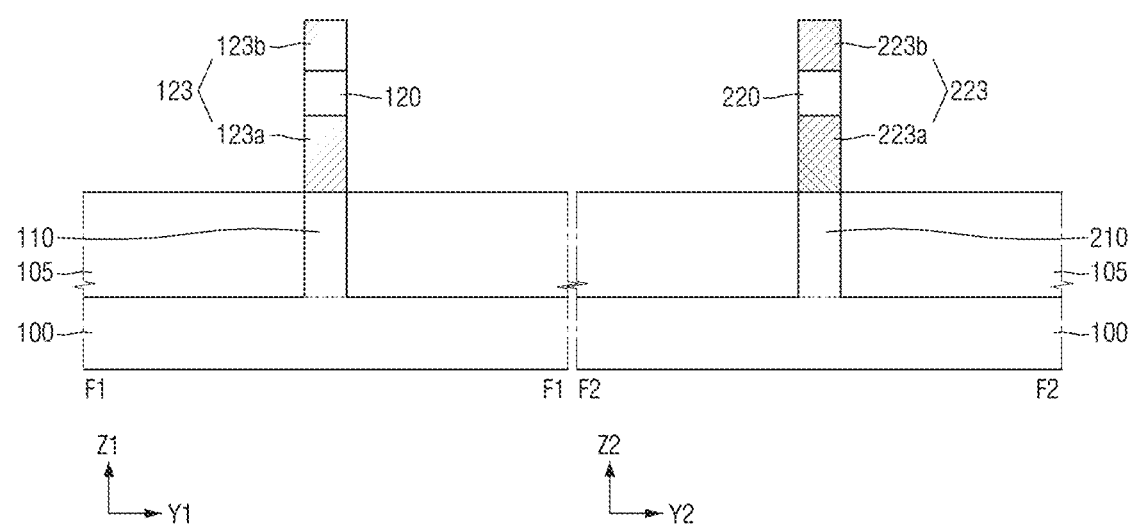
Figure 27:
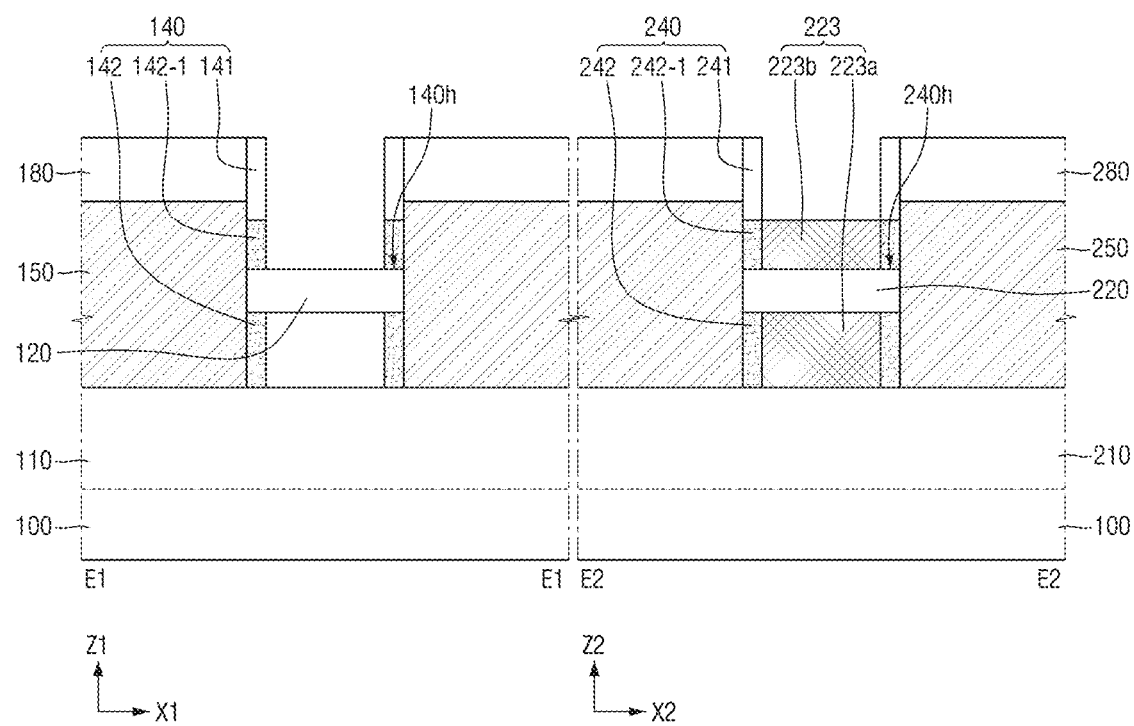
Figure 28:
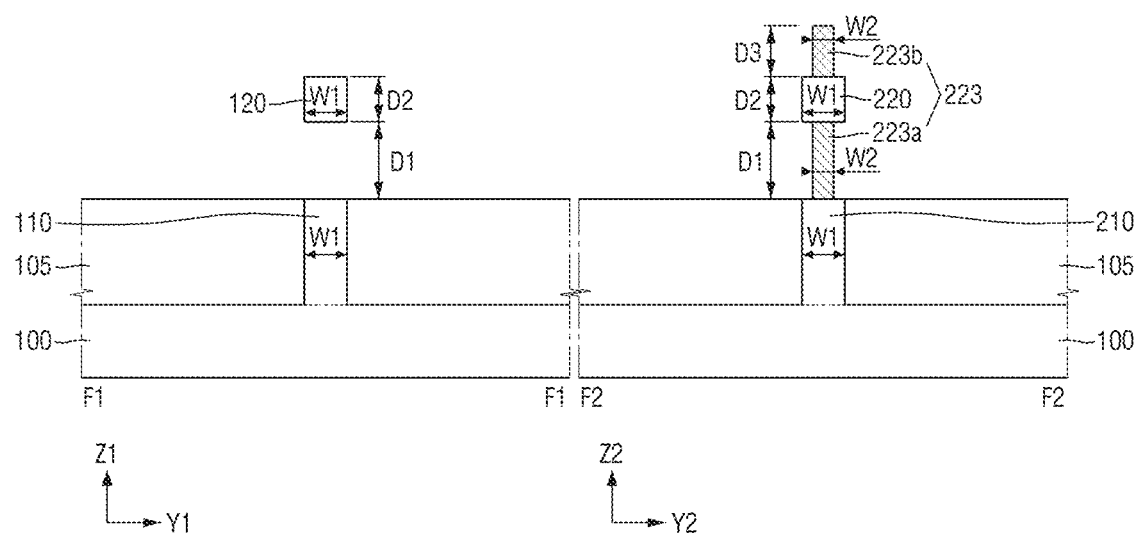
Figure 29:
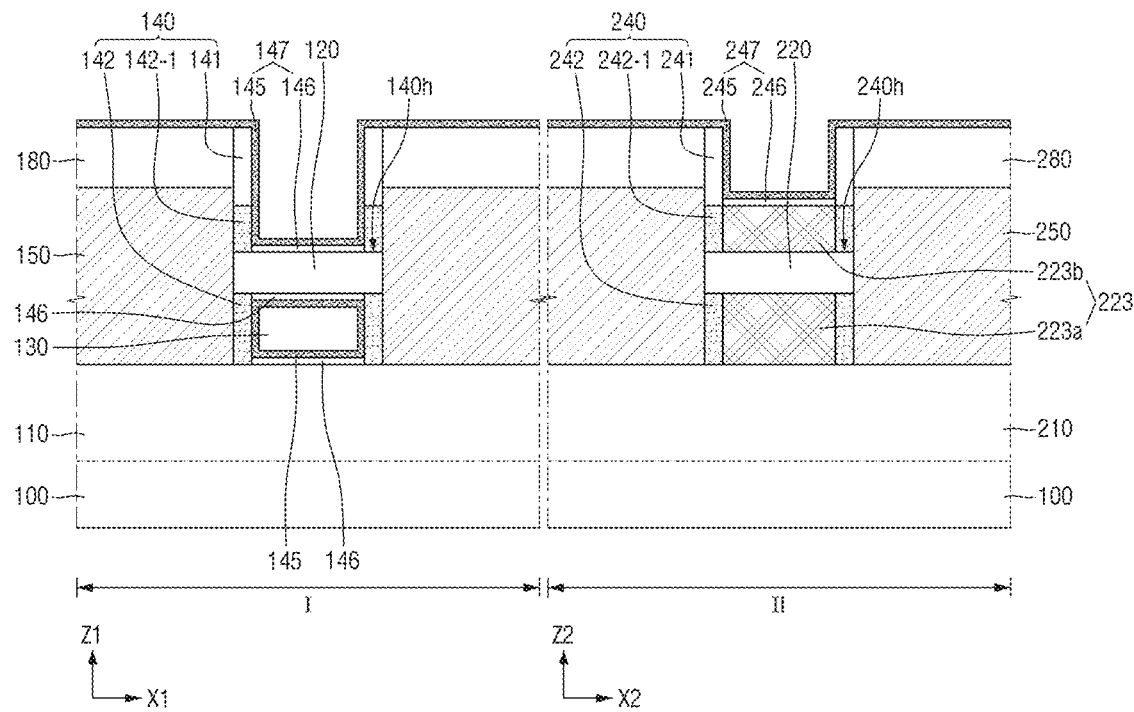
Figure 30:
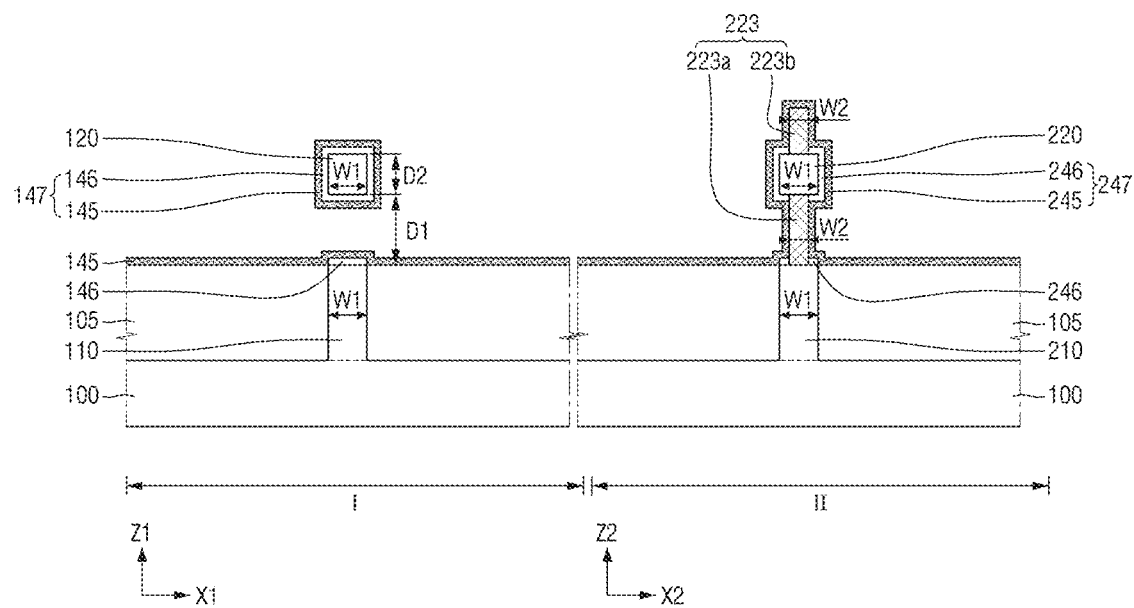

FIGS. 10 to 30 are views illustrating intermediate stages of fabrication, provided to explain a method for fabricating a semiconductor device according to some example embodiments. For reference, FIG. 21 are cross sectional views taken along the line D1-D1 and D2-D2 in FIG. 20, and FIG. 25 are cross sectional views taken along line E1-E1 and E2-E2 in FIG. 24. FIG. 26 are cross sectional views taken on lines F1-F1 and F2-F2 of FIG. 24. FIGS. 27 and 29 are sectional views corresponding to the sectional views of E1-E1 and E2-E2 in FIG. 24, and FIGS. 28 and 30 are sectional views corresponding to the sectional views of F1-F1 and F2-F2 in FIG. 24.

Figure 10:
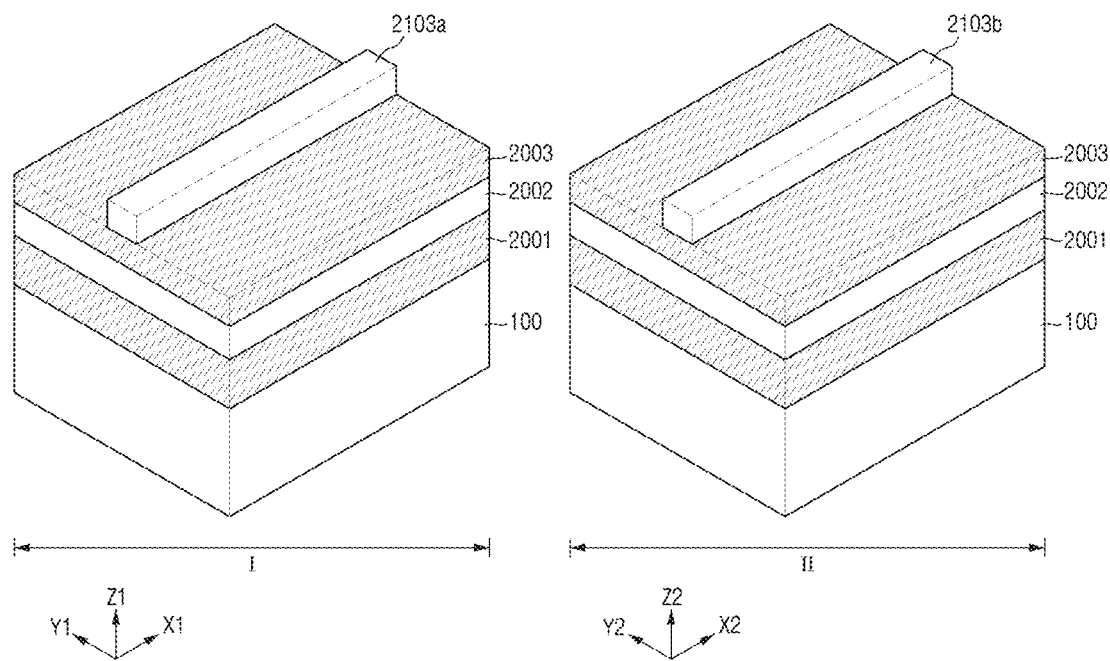
FIGS. 10 to 30 are views illustrating intermediate stages of fabrication, provided to explain a method for fabricating a semiconductor device according to some example embodiments.

Referring to FIG. 10, a first sacrificial layer 2001, an active film 2002, and a second sacrificial layer 2003 are formed sequentially on the substrate 100.

The first sacrificial layer 2001 and the second sacrificial layer 2003 may include the same material, and the first sacrificial layer 2001 and the active film 2002 may include different materials. In explaining a method for fabricating a semiconductor device according to some example embodiments, it is assumed that the first sacrificial layer 2001 and the second sacrificial layer 2003 include the same material. Further, the active film 2002 may include a material with an etch selectivity with respect to the first sacrificial layer 2001.

For example, the substrate 100 and the active film 2002 may include a material to be used as a channel region for the transistor. That is, in the case of PMOS, the active film 2002 may include a material of high hole mobility, while in the case of NMOS, the active film 2002 may include a material with high electron mobility.

The first sacrificial layer 2001 and the second sacrificial layer 2003 may include a material having a similar lattice constant and lattice structure as the active film 2002. That is, the first sacrificial layer 2001 and the second sacrificial layer 2003 may be a semiconductor material, or a crystallized metal material.

In explaining a method for fabricating a semiconductor device according to some example embodiments, it is assumed that the active film 2002 includes silicon, and the first sacrificial layer 2001 and the second sacrificial layer 2003 each include silicon germanium.

FIG. 10 illustrates only one active film 2002, but this is only for illustrative purpose and the embodiments are not limited thereto. Accordingly, there may be a plurality of pairs of first sacrificial layer 2001 and active film 2002 formed in alternation, with the second sacrificial layer 2003 being formed on the uppermost active film 2002.

Further, although FIG. 10 illustrates the second sacrificial layer 2003 being positioned on the uppermost portion of the stack layer structure, embodiments are not limited thereto. Accordingly, it is of course possible that the active film 2002 is positioned on the uppermost portion of the stack film structure.

Next, the first mask pattern 2103a is formed on the second sacrificial layer 2003 in the first region I, and the second mask pattern 2103b is formed on the second sacrificial layer 2003 in the second region II. The first mask pattern 2103a may elongate in a first direction X1, and the second mask pattern 2013b may elongate in the fourth direction X2.

For example, the first mask pattern 2103a and the second mask pattern 2103b may be formed of a material including at least one of silicon oxide film, silicon nitride film, and silicon oxynitride film.

Figure 11:
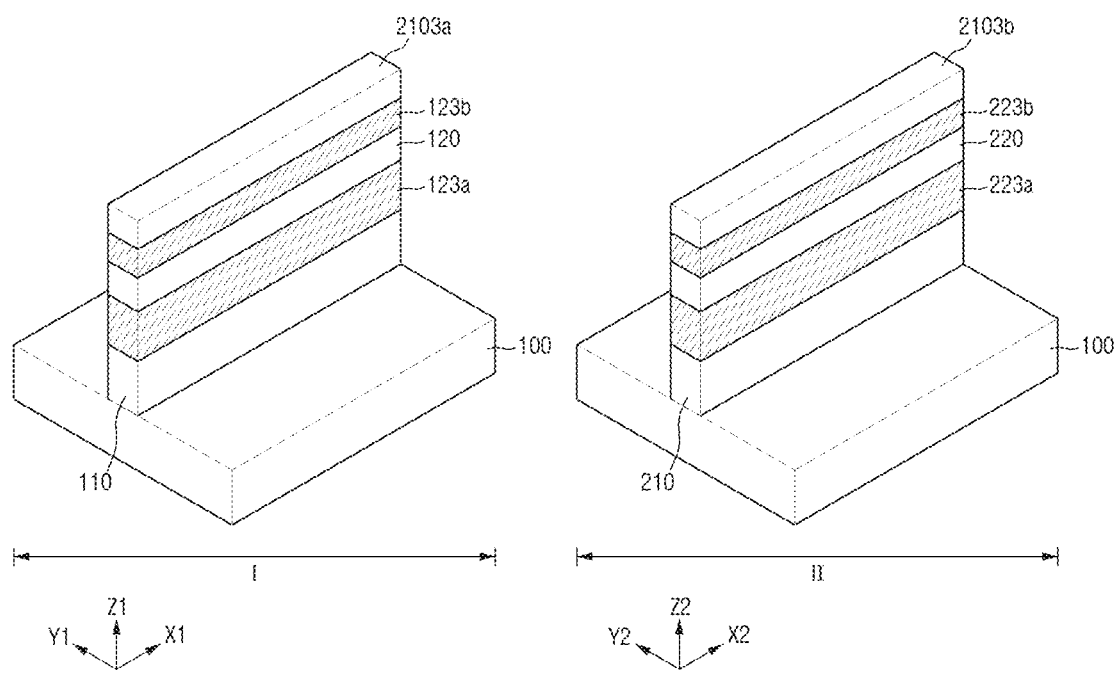

Referring to FIG. 11, the first fin-type structure 110P (FIG. 15) is formed by the etching process using the first mask pattern 2103a as a mask, and the second fin-type structure 210P (FIG. 15) is formed by the etching process using the second mask pattern 2103b as a mask.

The first and second fin-type structures 110P and 210P (FIG. 15) may be formed by patterning a portion of the second sacrificial layer 2003, the active film 2002, the first sacrificial layer 2001, and the substrate 100.

The first and second fin-type structures 110P and 210P (FIG. 15) may be formed on the substrate 100 and protruded from the substrate 100. Like the first and second fin-type structures 110P and 210P (FIG. 15), the first mask pattern 2103a and the second mask pattern 2103b may extend along the first direction X1 and the fourth direction X2, respectively.

In the first fin-type structure 110P (FIG. 15), a fin-type pattern 110, a first sacrificial pattern 123a, a first nanowire 120, and a second sacrificial pattern 123b may be stacked sequentially on the substrate 100.

In the second fin-type structure 210P (FIG. 15), a second fin-type pattern 210, a third sacrificial pattern 223a, a second nanowire 220, and a fourth sacrificial pattern 223b may be stacked sequentially on the substrate 100.

Figure 12:
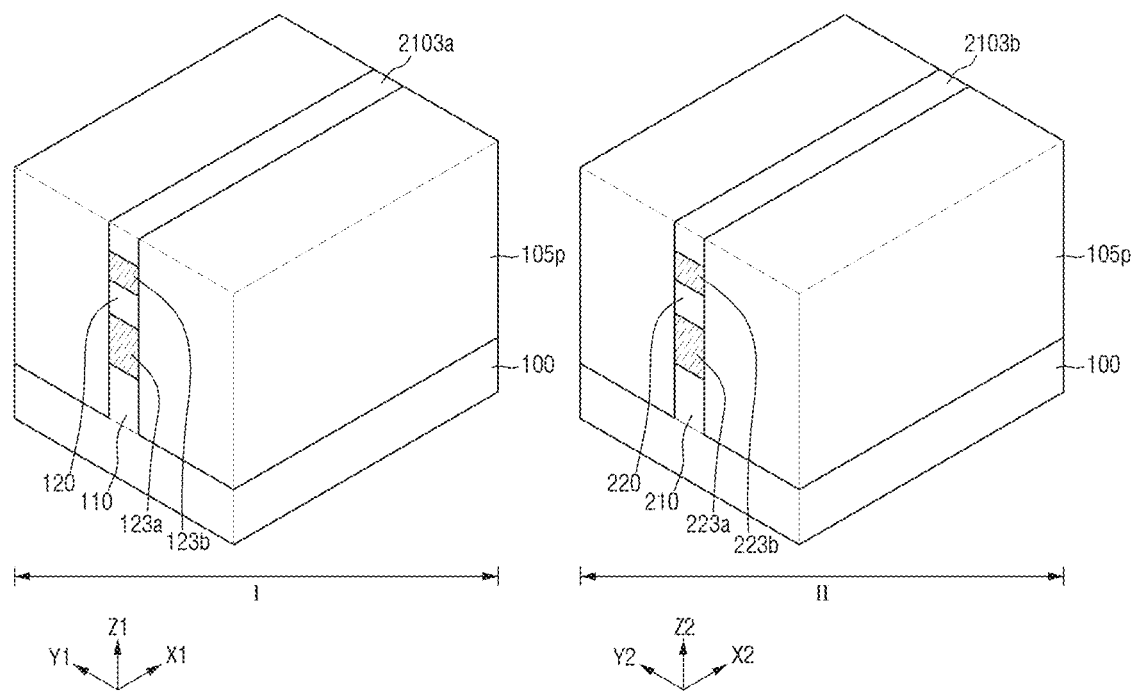

Next, referring to FIG. 12, a pre-field insulating film 105p is formed on the substrate 100.

Figure 15:
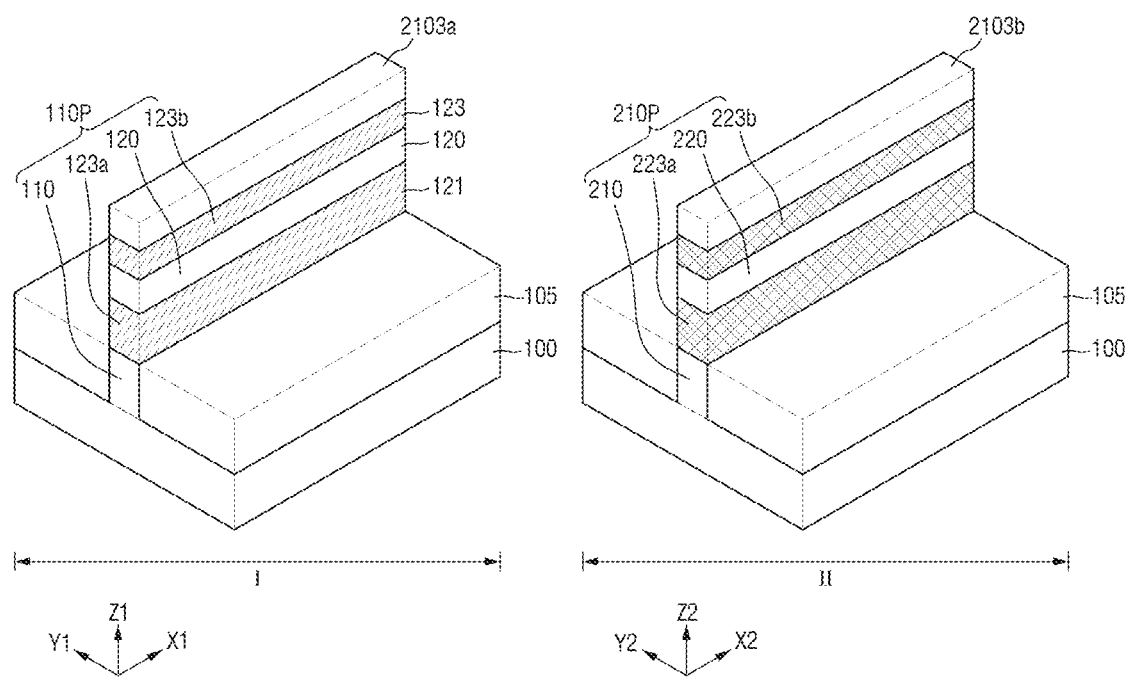
Figure 16:
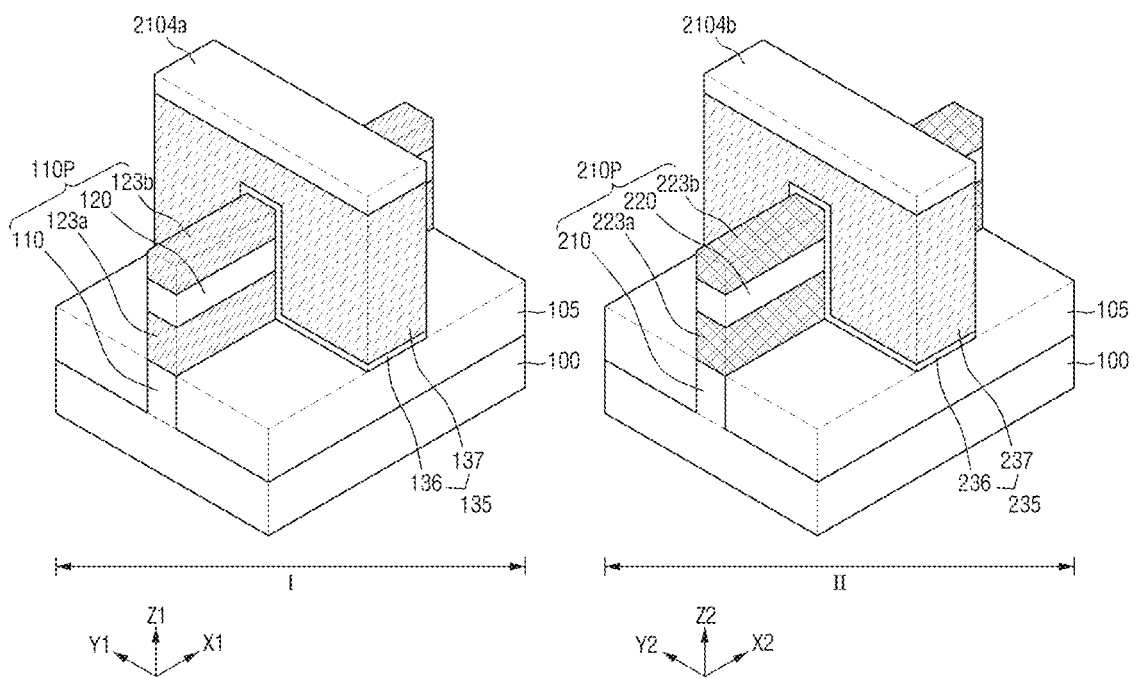

The pre-field insulating film 105p may completely cover the side surfaces of the first and second fin-type structures 110P and 210P (FIG. 15). The pre-field insulating film 105p may later become the field insulating film 105 (FIG. 15).

Figure 13:
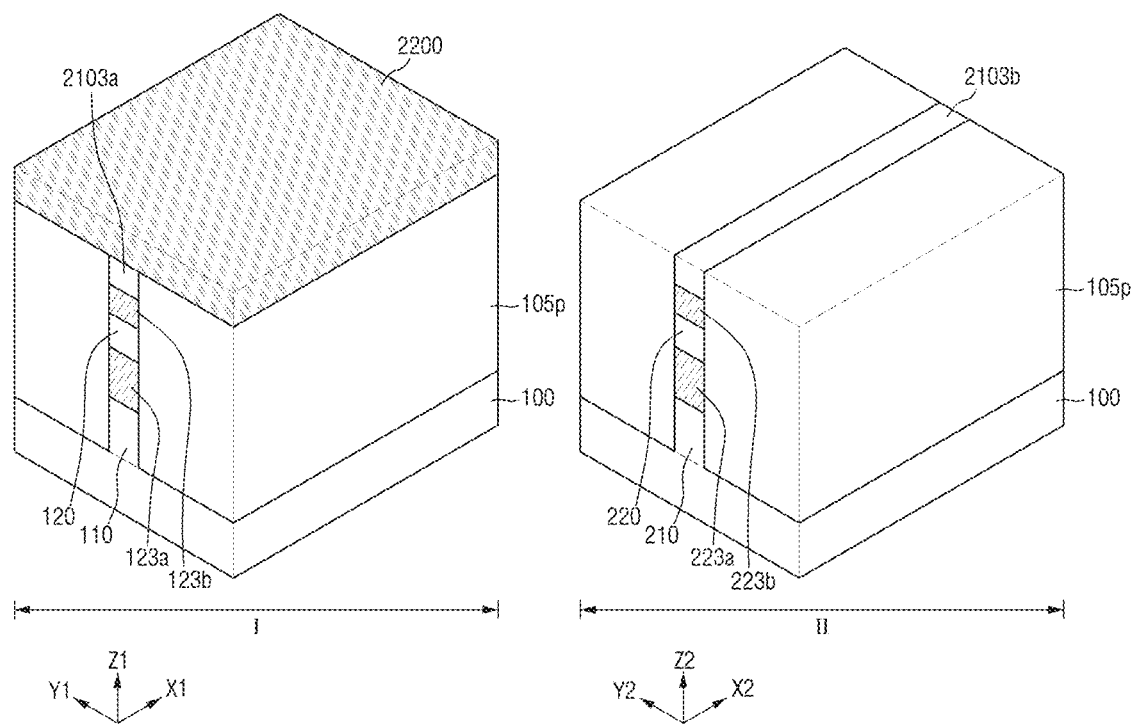

Next, referring to FIG. 13, a blocking film 2200 is formed on the pre-field insulating film 105p in the first region I.

The blocking film 2200 may expose the second region II. Through the blocking film 2200, a process such as ion implantation may be selectively performed later.

Figure 14:
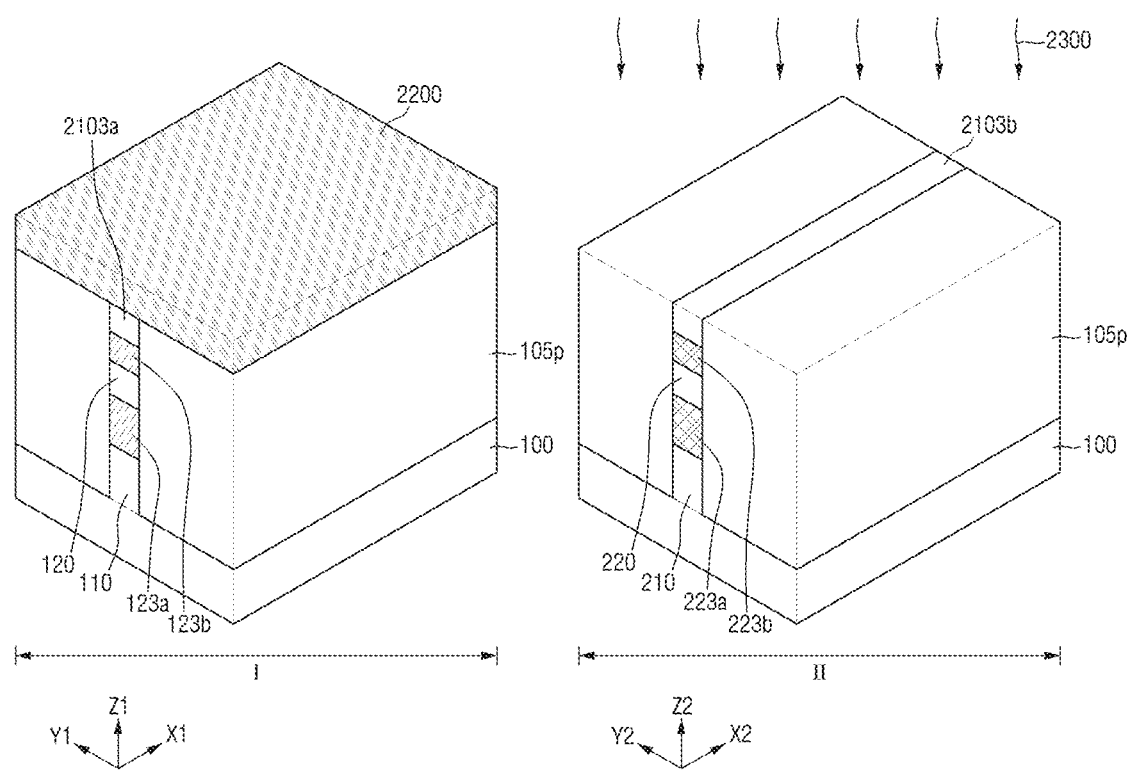

Next, referring to FIG. 14, an ion implantation 2300 is performed in the second region II.

The ion implantation 2300 may include phosphorus (P) or boron (B) ions. However, example embodiments are not limited to the example given above.

The etch selectivity of the third sacrificial pattern 223a and the fourth sacrificial pattern 223b of the second region II to the second fin-type pattern 210 and the second nanowire 220 may be lowered than before through the ion implantation 2300.

That is, the etch rates of the third sacrificial pattern 223a and the fourth sacrificial pattern 223b become lower such that more of the third sacrificial pattern 223a and the fourth sacrificial pattern 223b of the second region II may remain in a subsequent etching process, compared to the first sacrificial pattern 123a and the second sacrificial pattern 123b of the first region I.

Further, the impurity concentration of the second nanowire 220 of the second region II may be greater than that of the first nanowire 120 of the first region I through the ion implantation 2300. The impurity may include the above-mentioned ions, that is, phosphorus (P) or boron (B).

Next, referring to FIG. 15, a field insulating film 105 for covering at least a portion of a sidewall of the first fin-type structure 110P and a sidewall of the second fin-type structure 210P may be formed on the substrate 100.

More specifically, through the planarization process of a pre-field insulation film 105p covering all the first fin-type structure 110P and the second fin-type structure 210P on the substrate 100, the upper surfaces of the first fin-type structure 110P and the second fin-type structure 210P and the upper surface of the field insulating film 105 may be placed on the same plane, and the first mask pattern 2103a and the second mask pattern 2103b may be removed during such planarization process, although example embodiments are not limited thereto.

The upper portion of the pre-field insulating film 105p is then recessed, thus exposing a portion of the first fin-type structure 110P and the second fin-type structure 210P. The recess process may include a selective etch process. That is, the first fin-type structure 110P and the second fin-type structure 210P may be formed, protruding on the field insulating film 105.

Referring to FIG. 15, the first fin-type pattern 110, the first sacrificial pattern 121, the first nanowire 120, and the second sacrificial pattern 123 may be protruded above the upper surface of the field insulating film 105, and the sidewall of the first fin-type pattern 110 may be entirely surrounded by the field insulating film 105, but example embodiments are not limited thereto. That is, a portion of the sidewall of the first fin-type pattern 110 may be protruded above the upper surface of the field insulating film 105 through the upper portion recessing process of the field insulating film 105. In the second region II, a portion of the sidewall of the second fin-type pattern 210 may likewise be protruded above the upper surface of the field insulating film 105.

Doping for the purpose of threshold voltage adjustment may be performed on the first nanowire 120 and the second nanowire 220 before and/or after the recessing process that causes a portion of the fin-type structure 110P to protrude above the upper surface of the field insulating film 105. When the semiconductor device is an NMOS transistor, impurity may be boron (B). When the semiconductor device is a PMOS transistor, the impurity may be phosphorus (P) or arsenic (As), but not limited thereto.

Figure 18:
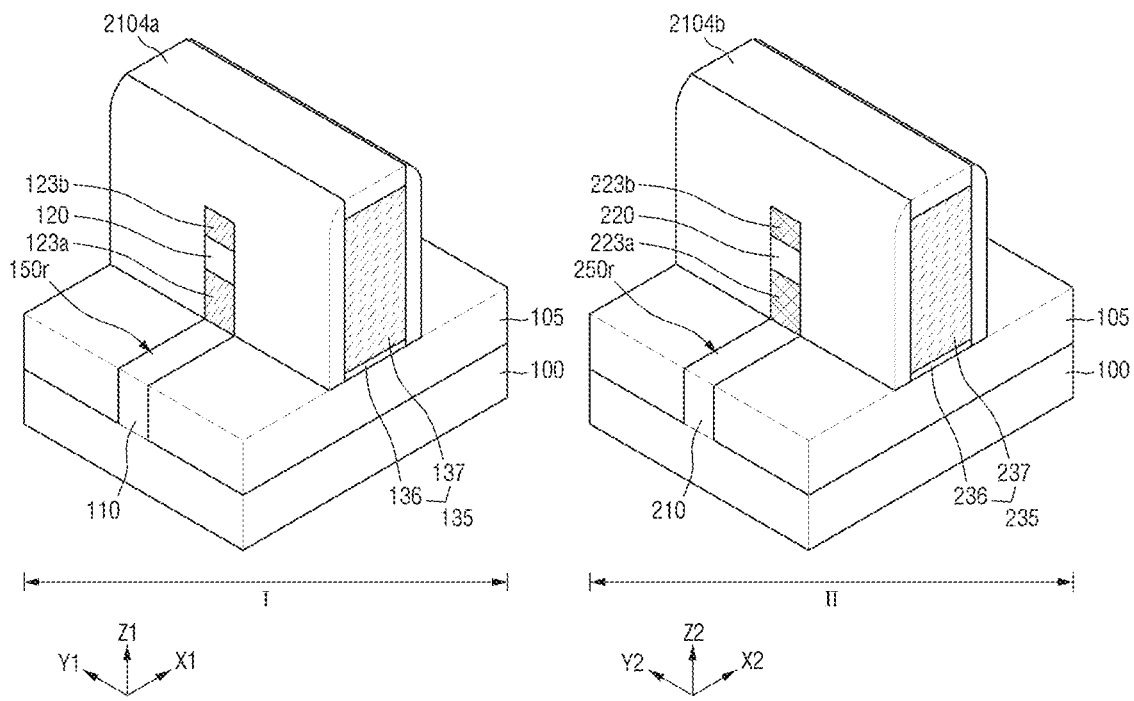

Referring to FIG. 18, the etching process is performed using the third mask pattern 2104a and the fourth mask pattern 2104*b* to form the first dummy gate pattern 135 and the second dummy gate pattern 235 which extend in the second direction Y1 and the fifth direction Y2 by intersecting the first fin-type structure 110P and the second fin-type structure 210P, respectively. The first dummy gate pattern 135 and the second dummy gate pattern 235 may be formed on the first fin-type structure 110P and the second fin-type structure 210P, respectively.

The first dummy gate pattern 135 may include a first dummy gate insulating film 136 and a first dummy gate electrode 137. For example, the first dummy gate insulating film 136 may include a silicon oxide film, and the first dummy gate electrode 137 may include polysilicon or amorphous silicon.

The second dummy gate pattern 235 may likewise include a second dummy gate insulating film 236 and a second dummy gate electrode 237. For example, the second dummy gate insulating film 236 may include a silicon oxide film, and the second dummy gate electrode 237 may include polysilicon or amorphous silicon.

Figure 17:
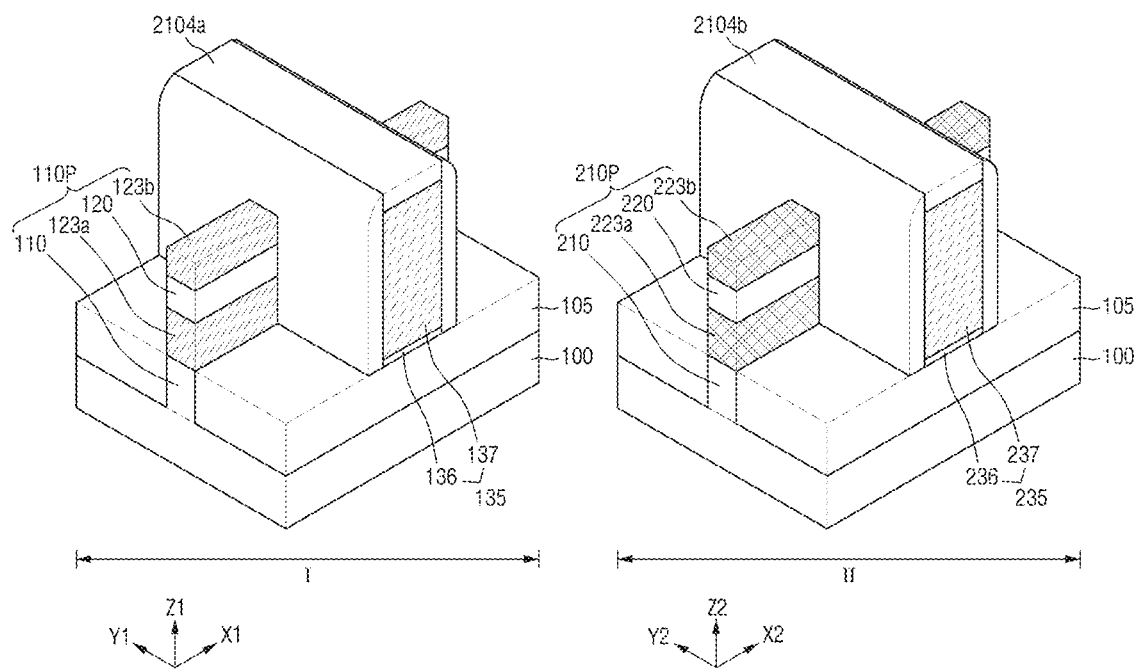

Referring to FIG. 17, the first outer spacer 141 may be formed on the sidewall of the first dummy gate pattern 135. That is, the first outer spacer 141 may be formed on the sidewalls of the first dummy gate insulating film 136 and the first dummy gate electrode 137.

Further, the second outer spacer 241 may be formed on the sidewall of the second dummy gate pattern 235. That is, the second outer spacer 241 may be formed on the sidewalls of the second dummy gate insulating film 236 and the second dummy gate electrode 237.

Referring to FIG. 18, the first fin-type structure 110P non-overlapped with the first dummy gate electrode 137 and the first outer spacer 141 is removed by using the first dummy gate pattern 135 including the first dummy gate electrode 137 as a mask. As a result, a first recess 150*r* may be formed within the first fin-type structure 110P. A bottom surface of the first recess 150*r* may be the first fin-type pattern 110. That is, the first fin-type pattern 110 that is not protruded from the field insulating film 105 may remain.

Forming the first outer spacer 141 and forming the first recess 150*r* may be concurrently performed, although example embodiments are not limited thereto. That is, the first recess 150*r* may be formed after the outer spacer 141 is formed, by partially removing the first fin-type structure 110P.

While the first recess 150*r* is being formed in the first fin-type structure 110P, the first sacrificial pattern 123*a* and the second sacrificial pattern 123*b* non-overlapped with the first dummy gate electrode 137 and the first outer spacer 141 may be removed. Further, while the first recess 150*r* is being formed in the first fin-type structure 110P, the first nanowire 120 may be formed with the removal of the first nanowire 120 non-overlapped with the first dummy gate electrode 137 and the first outer spacer 141.

Due to the presence of the first recess 150*r*, the cross section of the first sacrificial pattern 123*a*, the cross section of the second sacrificial pattern 123*b*, and the cross section of the first nanowire 120 may be exposed.

The second fin-type structure 210P non-overlapped with the second dummy gate electrode 237 and the second outer spacer 241 is likewise removed by using the second dummy gate pattern 235 including the second dummy gate electrode 237 as a mask. As a result, a second recess 250*r* may be formed within the second fin-type structure 210P. A bottom surface of the second recess 250*r* may be the second fin-type pattern 210. That is, the second fin-type pattern 210 that is not protruded from the field insulating film 105 may remain.

While the second recess 250*r* is being formed in the second fin-type structure 210P, the third sacrificial pattern 223*a* and the fourth sacrificial pattern 223*b* non-overlapped with the second dummy gate electrode 237 and the second outer spacer 241 may be removed. Further, while the second recess 250*r* is being formed in the second fin-type structure 210P, the second nanowire 220 may be formed with the removal of the second nanowire 220 non-overlapped with the second dummy gate electrode 237 and the second outer spacer 241.

Figure 19:
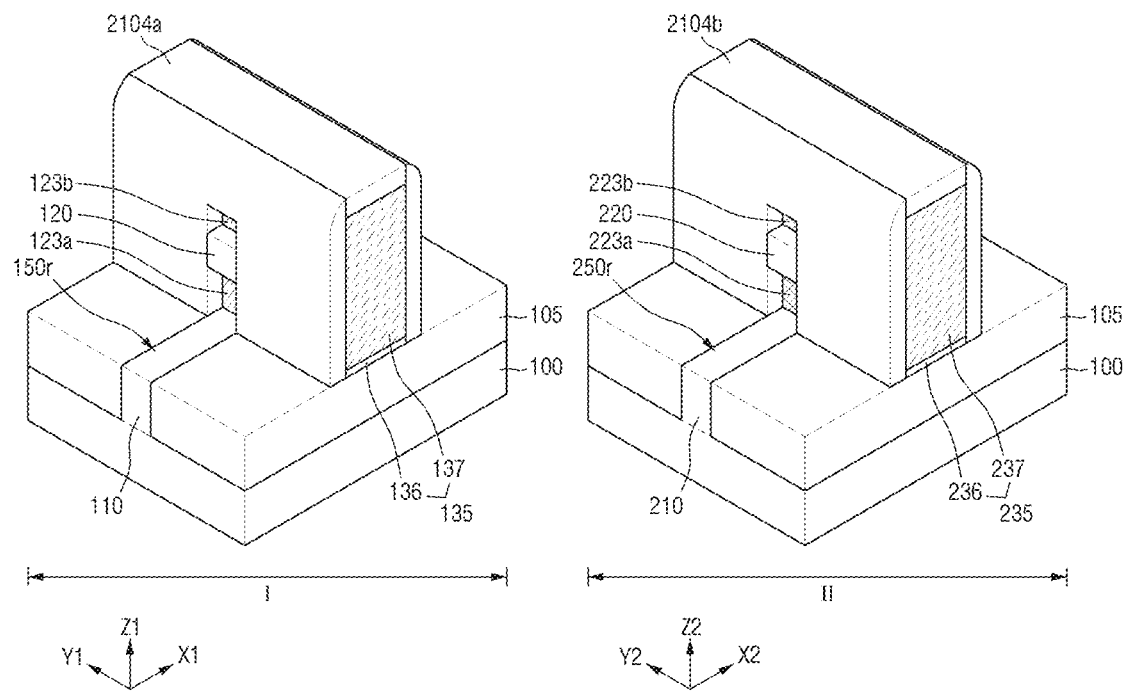

Referring to FIG. 19, at least a portion of the first sacrificial pattern 123*a* and a portion of the second sacrificial pattern 123*b*, which are exposed by the first recess 150*r* and overlapped with the first outer spacer 141, may be removed. As a result, a dimple may be formed between the first outer spacers 141. The dimple may also be formed between the first outer spacer 141 and the first nanowire 120, that is, in a portion horizontally overlapped with the second sacrificial pattern 123*b*.

The dimple may be in a shape that is depressed in the first direction X1 further than the cross section of the first nanowire 120 exposed by the first recess 150*r*.

For example, the dimple may be formed with selective etch process. Specifically, the dimple may be formed by the etch process that uses an etchant with a higher etch rate for the first sacrificial pattern 121 and the second sacrificial pattern 123, compared to the etch rate for the first nanowire 120.

In the second region II, a portion of the third sacrificial pattern 223*a* and a portion of the fourth sacrificial pattern 223*b*, which are exposed by the second recess 250*r* and overlapped with the second outer spacer 241, may also be removed. As a result, a dimple may be formed between the second outer spacers 241. The dimple may also be formed between the second outer spacer 241 and the second nanowire 220, that is, in a portion horizontally overlapped with the third sacrificial pattern 223*b*.

The dimple may be in a shape that is depressed in the fourth direction X2 further than the cross section of the second nanowire 220 exposed by the second recess 250*r*.

Referring to FIGS. 20 and 21, the dimple may be filled with an insulating material so as to form the first inner spacer 142 and the second inner spacer 142-1.

For example, a second spacer film for filling the dimple may be formed. The second spacer film may be a material with a good gap-filling capability. The second spacer film may also be formed on the field insulating film 105, the sidewall of the first outer spacer 141, and the first dummy gate pattern 135.

Etch process may then be performed by etching the second spacer film until the upper surface of the first fin-type pattern 110 non-overlapped with the first dummy gate pattern 135 and the first outer spacer 141 is exposed. As a result, the first inner spacer 142 and the second inner spacer 142-1 may be formed. As a result, the first gate spacer 140 may be formed.

Further, a through hole, defined by the first outer spacer 141, the first inner spacer 142, and the second inner spacer 142-1, may be formed in the first gate spacer 140. The first nanowire 120 may be exposed through the through hole. That is, the first nanowire 120 may be passed through the through hole.

In the second region II, the third inner spacer 242 and the fourth inner spacer 242-1 may also be formed. A through hole, defined by the second outer spacer 241, the third inner spacer 242, and the fourth inner spacer 242-1, may be formed in the second gate spacer 240. The second nanowire 220 may be exposed through the through hole. That is, the second nanowire 220 may be passed through the through hole.

Figure 22:
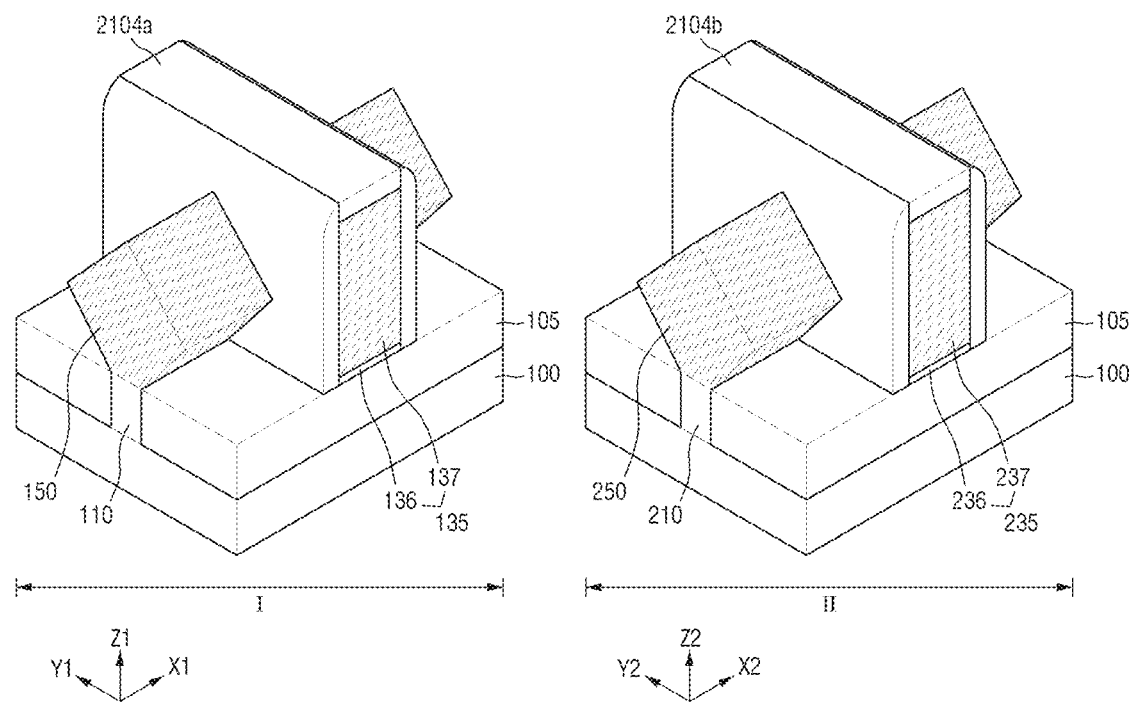

Referring to FIG. 22, a first source/drain 150 for filling the first recess 150r may be formed. The first source/drain 150 may be formed on either side of the first dummy gate pattern 135.

The first source/drain 150 may be formed with the exposed first nanowire 120 as the seed layer, although embodiments are not limited thereto. It is of course possible that the seed film is additionally formed on the protruding cross section of the first nanowire 120 and the first fin-type pattern 110 that are exposed by the first recess 150r.

The first source/drain 150 may be formed so as to cover the first inner spacer 142. The first source/drain 150 may contact the first inner spacer 142.

The first source/drain 150 may be formed by epitaxial process. Depending on whether the semiconductor device according to example embodiments is an n-type transistor or p-type transistor, the materials for the epitaxial layer included in the first source/drain 150 may vary. Further, depending on needs, impurity may be doped in situ during epitaxial process.

A second source/drain 250 for filling the second recess 250r may likewise be formed. The second source/drain 250 may be formed on either side of the second dummy gate pattern 235.

Figure 23:
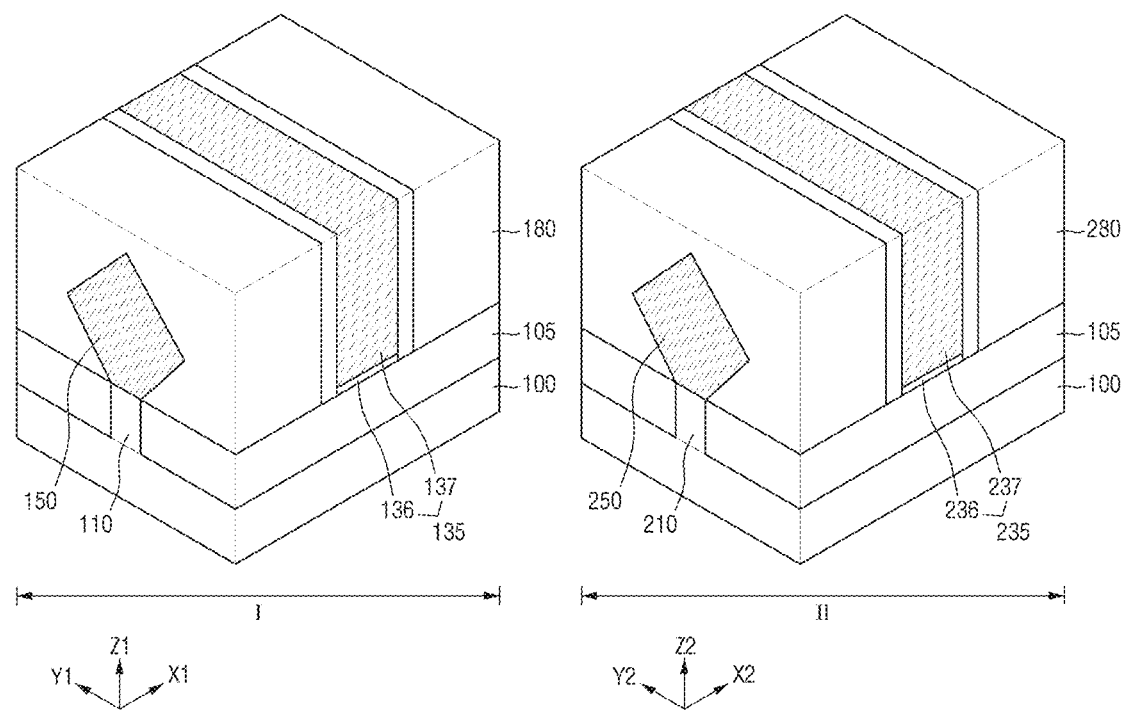

Referring to FIG. 23, the first interlayer insulating film 180 may be formed on the field insulating film 105, covering the first source/drain 150, the first gate spacer 140, the first dummy gate pattern 135, and so on.

Further, the second interlayer insulating film 280 may be formed on the field insulating film 105, covering the second source/drain 250, the second gate spacer 240, the second dummy gate pattern 235, and so on.

The first interlayer insulating film 180 and the second interlayer insulating film 280 may include at least one of low-k material, an oxide film, a nitride film, and an oxynitride film. For example, the low-k material may be flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), high density plasma (HDP) oxide, plasma enhanced oxide (PEOX), flowable CVD (FCVD) oxide, or a combination thereof.

The first interlayer insulating film 180 and the second interlayer insulating film 280 are then planarized until the upper surfaces of the first dummy gate electrode 137 and the second dummy gate electrode 237 are exposed. As a result, the third mask pattern 2104a and the fourth mask pattern 2104b may be removed, and the upper surfaces of the first dummy gate electrode 137 and the second dummy gate electrode 237 may be exposed.

Referring to FIGS. 24 to 26, the first dummy gate pattern 135 and the second dummy gate pattern 235 may be removed.

With the removal of the first dummy gate pattern 135 and the second dummy gate pattern 235, the field insulating film 105 and the first fin-type structure 110P and the second fin-type structure 210P overlapped with the first dummy gate pattern 135 and the second dummy gate pattern 235 may be exposed. That is, in the first region I, the first sacrificial pattern 123a, the second sacrificial pattern 123b, and the first nanowire 120 which were overlapped with the first dummy gate pattern 135 may be exposed, and in the second region II, the third sacrificial pattern 223a, the fourth sacrificial pattern 223b, and the second nanowire 220 which were overlapped with the second dummy gate pattern 235 may be exposed.

Referring to FIGS. 27 and 28, the first sacrificial pattern 123a and the second sacrificial pattern 123b of the first fin-type structure 110P in the first region I may be removed.

As a result, the first nanowire 120 may be exposed on the first fin-type pattern 110.

Removing the first sacrificial pattern 123a and the second sacrificial pattern 123b positioned over and under the first nanowire 120 may involve use of etch process, for example. That is, etch selectivity between the first sacrificial pattern 123a and the second sacrificial pattern 123b, and the first nanowire 120 may be utilized.

On the other hand, as the etch rate of the third sacrificial pattern 223a and the fourth sacrificial pattern 223b is lowered by the ion implantation 2300 of FIG. 14, in the second region II, the third sacrificial pattern 223a and the fourth sacrificial pattern 223b may not be completely removed. That is, the third sacrificial pattern 223a and the fourth sacrificial pattern 223b may be removed partially to become the supporting pattern 223 and the second supporting pattern 223b, respectively.

Referring to FIGS. 29 and 30, a first gate insulating film 147 is formed conformally in the first region I, and a second gate insulating film 247 is formed conformally in the second region II.

The first interfacial layer 146 of the first gate insulating film 147 may formed on the periphery of the first nanowire 120 and on the upper surface of the first fin-type pattern 110, and the first high-k insulating film 145 may also be formed on the periphery of the nanowire 120, the upper surface of the first fin-type pattern 110, and the inner surface of the first gate spacer 147. Furthermore, the first high-k insulating film 145 may extend to the upper surface of the first interlayer insulating film 180.

The second interfacial layer 246 of the second gate insulating film 247 may be formed on the periphery of the exposed second nanowire 220 and on the upper surface of the exposed second fin-type pattern 210, and the second high-k insulating film 245 may be formed to surround the second nanowire 220 and the supporting pattern 223. Furthermore, the second high-k insulating film 245 may extend to the upper surface of the second interlayer insulating film 280.

According to the supporting pattern 223, the location where the second gate insulating film 247 is formed may be different from the location where the first gate insulating film 147 is formed. That is, the second gate insulating film 247 may be formed only on the exposed portion of the periphery of the second nanowire 220.

Next, referring to FIGS. 1 to 4, a first gate electrode 130 and a second electrode 230 are formed.

While some example embodiments of inventive concepts have been particularly shown and described, it will be understood by those of ordinary skill in the art that various changes in form and details may be made therein without departing from the spirit and scope of inventive concepts as defined by the following claims. It is therefore desired that the present disclosure considered in all respects as illustrative and not restrictive.

What is claimed is:

1. A semiconductor device, comprising:
   a substrate including a first region and a second region;
   a first nanowire on the first region, the first nanowire extending in a first direction and being spaced apart from the substrate;

a first gate electrode surrounding the first nanowire, the first gate electrode is disposed on an upper surface and a lower surface of the first nanowire;
a first source/drain connected with the first nanowire;
a second nanowire on the second region, the second nanowire extending in the first direction and being spaced apart from the substrate;
a supporting pattern contacting at least a portion of the second nanowire;
a second gate electrode surrounding at least a portion of the second nanowire, the second gate electrode is disposed on an upper surface of the second nanowire and is not formed on a lower surface of the second nanowire; and
a second source/drain connected with the second nanowire;
wherein a width in the first direction of the second nanowire is greater than that of the supporting pattern.

2. The semiconductor device of claim 1, wherein the supporting pattern is disposed on the lower surface of the second nanowire.

3. The semiconductor device of claim 1, further comprising:
a first blocking insulating pattern is disposed between the first source/drain and the first gate electrode on the lower surface of the first nanowire, and partially disposed between the first source/drain and the first gate electrode on the upper surface of the first nanowire; and
a second blocking insulating pattern is disposed between the second source/drain and the supporting pattern, and not disposed between the second source/drain and the second gate electrode.

4. The semiconductor device of claim 3, further comprising:
a first gate spacer formed on both sidewalls of the first gate electrode and on the first blocking insulating pattern; and
a second gate spacer formed on both sidewalls of the second gate electrode.

5. The semiconductor device of claim 4, the first and second gate spacers has a first dielectric constant that is greater than a second dielectric constant of the first and second blocking insulating patterns.

6. The semiconductor device of claim 1, wherein the first gate electrode extends in a second direction different from the first direction, and
wherein a side surface of the supporting pattern in the second direction is concave inward.

7. The semiconductor device of claim 6, wherein a side surface of the second nanowire in the second direction is convex outward.

8. The semiconductor device of claim 1, wherein the first region is a low voltage region, and the second region is a high voltage region.

9. A semiconductor device, comprising:
a substrate including first and second regions;
a first nanowire on the first region and spaced apart from the substrate;
a second nanowire on the first nanowire and spaced apart from the first nanowire;
a first gate electrode surrounding the first and second nanowires;
a fin pattern extending in a first direction on the second region and comprising a first semiconductor pattern, a second semiconductor pattern spaced apart from the first semiconductor pattern, and a third semiconductor pattern contacting at least one of the first and second semiconductor patterns; and
a second gate electrode extending in a second direction different from the first direction and intersecting the fin pattern,
wherein a distance from the substrate to the first nanowire, a distance from first nanowire to the second nanowire, and a thickness of the second nanowire are different from each other, and
wherein a distance from the substrate to the first semiconductor pattern, a distance from the first semiconductor pattern to the second semiconductor pattern, and a thickness of the second semiconductor pattern are different from each other.

10. The semiconductor device of claim 9, wherein the distance from the substrate to the first nanowire is the same as the distance from the substrate to the first semiconductor pattern.

11. The semiconductor device of claim 10, wherein the distance from the substrate to the first semiconductor pattern is the same as a thickness of the third semiconductor pattern between the substrate and the first semiconductor pattern.

12. The semiconductor device of claim 10, wherein the distance from first nanowire to the second nanowire is the same as the distance from the first semiconductor pattern to the second semiconductor pattern, and
wherein the thickness of the second nanowire is the same as the thickness of the second semiconductor pattern.

13. The semiconductor device of claim 9, wherein distance from the substrate to the first semiconductor pattern is the same as a thickness of the third semiconductor pattern between the substrate and the first semiconductor pattern.

14. The semiconductor device of claim 9, wherein a width of the first semiconductor pattern in the second direction is greater than that of the second semiconductor pattern.

15. A semiconductor device, comprising:
a substrate including a first region and a second region;
a nanosheet structure disposed on the first region of the substrate, and including a first nanowire and a first gate electrode that surrounds the first nanowire; and
a fin structure disposed on the second region of the substrate, and including a first semiconductor pattern, a second semiconductor pattern contacting the first semiconductor pattern, and a second gate electrode intersecting the first semiconductor pattern and the second semiconductor pattern,
wherein a first distance between the first nanowire and the substrate and a second distance between the first semiconductor pattern on the substrate are the same as each other, and
wherein a lower surface of the first gate electrode positioned on an upper surface of the first nanowire is lower than a lower surface of the second gate electrode positioned on an upper surface of the second semiconductor pattern.

16. The semiconductor device of claim 15, wherein a width of the first semiconductor pattern is greater than that of the second semiconductor pattern.

17. The semiconductor device of claim 15, wherein an impurity concentration of the first semiconductor pattern is greater than that of the first nanowire.

18. The semiconductor device of claim 15, wherein the first semiconductor pattern has a material different from the second semiconductor pattern.

19. The semiconductor device of claim 15, wherein the second semiconductor pattern includes the same impurity as the first semiconductor pattern.

20. The semiconductor device of claim 15, wherein the first region is an active region, and the second region is a dummy region.

* * * * *